US012745374B2

(12) United States Patent
Qiu et al.

(10) Patent No.: US 12,745,374 B2
(45) Date of Patent: Sep. 22, 2026

(54) HEAT EXCHANGE DEVICE AND HEAT EXCHANGE SYSTEM

(71) Applicant: HUAWEI DIGITAL POWER TECHNOLOGIES CO., LTD., Futian District (CN)

(72) Inventors: Yongqi Qiu, Shenzhen (CN); Jiyang Li, Dongguan (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 194 days.

(21) Appl. No.: 18/756,775

(22) Filed: Jun. 27, 2024

(65) Prior Publication Data

US 2024/0349463 A1 Oct. 17, 2024

Related U.S. Application Data

(63) Continuation of application No. PCT/CN2023/095775, filed on May 23, 2023.

(30) Foreign Application Priority Data

May 27, 2022 (CN) ......................... 202210599918.7

(51) Int. Cl.
*H05K 7/20* (2006.01)

(52) U.S. Cl.
CPC ......... *H05K 7/208* (2013.01); *H05K 7/20309* (2013.01); *H05K 7/20318* (2013.01); *H05K 7/20327* (2013.01); *H05K 7/20354* (2013.01)

(58) Field of Classification Search
CPC ............... H05K 7/208; H05K 7/20372; H05K 7/20309; H05K 7/20318; H05K 7/20327; H05K 7/20354; F25B 13/00; F25B 41/34; F25B 2400/0401; F25B 41/20; F25B 41/40; F24F 5/00; F24F 13/30
See application file for complete search history.

(56) References Cited

FOREIGN PATENT DOCUMENTS

| | | | |
|---|---|---|---|
| CN | 2515607 | Y | 10/2002 |
| CN | 101245864 | A | 8/2008 |
| CN | 101245955 | A | 8/2008 |
| CN | 101514856 | A | 8/2009 |
| CN | 201611151 | U | 10/2010 |

(Continued)

*Primary Examiner* — Emmanuel E Duke
(74) *Attorney, Agent, or Firm* — WOMBLE BOND DICKINSON (US) LLP

(57) ABSTRACT

This application provides a heat exchange device and a heat exchange system. The heat exchange device has a first heat exchange mode, and includes a housing, a partition plate, an evaporator, and a compressor. The partition plate divides space inside the housing into an internal circulation cavity and an external circulation cavity. The evaporator and the compressor are located in the internal circulation cavity. A first valve group is disposed between an inlet of the compressor and an outlet of the evaporator. When the first heat exchange mode is used for heat exchange, the evaporator is communicated with the compressor by using the first valve group. In this application, the compressor is disposed in the internal circulation cavity, so that a temperature difference between the compressor and the evaporator is small, thereby reducing a slugging risk of the compressor.

20 Claims, 24 Drawing Sheets

(56) References Cited

FOREIGN PATENT DOCUMENTS

| | | | | | |
|---|---|---|---|---|---|
| CN | 102278840 | A | | 12/2011 | |
| CN | 103307658 | A | * | 9/2013 | ............. H05K 7/207 |
| CN | 203605382 | U | * | 5/2014 | |
| CN | 205678782 | U | | 11/2016 | |
| CN | 107560027 | A | | 1/2018 | |
| CN | 111043781 | A | | 4/2020 | |
| CN | 210950038 | U | * | 7/2020 | |
| CN | 111649424 | A | | 9/2020 | |
| CN | 114322345 | A | * | 4/2022 | ............... H05K 7/20 |
| CN | 114518000 | A | * | 5/2022 | ........... F25D 17/062 |
| CN | 114963623 | A | | 8/2022 | |
| JP | 2001066031 | A | | 3/2001 | |
| JP | 2015114084 | A | * | 6/2015 | |

* cited by examiner

HEAT EXCHANGE DEVICE AND HEAT EXCHANGE SYSTEM

CROSS-REFERENCE TO RELATED APPLICATIONS

This application is a continuation of International Application No. PCT/CN2023/095775, filed on May 23, 2023, which claims priority to Chinese Patent Application No. 202210599918.7, filed on May 27, 2022. The disclosures of the aforementioned applications are hereby incorporated by reference in their entireties.

TECHNICAL FIELD

This application relates to the field of heat exchange technologies, and in particular, to a heat exchange device and a heat exchange system.

BACKGROUND

Devices in outdoor cabinets or equipment rooms generate a large amount of heat during continuous operation. A continuous increase in temperature affects operating efficiency of the devices in the cabinets or the equipment rooms. Currently, air conditioners and heat exchangers are used for heat dissipation. However, the air conditioners deployed in the outdoor cabinets or the equipment rooms consume high energy. The heat exchangers deployed in the outdoor cabinets or the equipment rooms for heat dissipation consume low energy, but cannot meet refrigeration requirements in high ambient temperature. A compression refrigeration cycle air conditioner and heat exchange integrated machine may work in a heat exchange mode when ambient temperature is low, and work in a compression refrigeration mode when ambient temperature is high. This reduces energy and meets requirements for use in the high ambient temperature. However, currently, because a compression refrigeration cycle system and a gravity heat pipe cycle system in the compression refrigeration cycle air conditioner and heat exchange integrated machine are independent of each other, there are two groups of evaporators and two groups of condensers, which are large in size, heavy in weight, and high in cost. In addition, a compressor is disposed in an outdoor environment, and has a slugging risk.

SUMMARY

This application provides a heat exchange device and a heat exchange system that can reduce a slugging risk of a compressor.

According to a first aspect, this application provides a heat exchange device that has a first heat exchange mode. The heat exchange device includes a housing, a partition plate, an evaporator, and a compressor. The partition plate divides space inside the housing into an internal circulation cavity and an external circulation cavity. The internal circulation cavity is configured to be communicated with an indoor environment, and the external circulation cavity is configured to be communicated with an outdoor environment. The evaporator is located in the internal circulation cavity. The compressor is located in the internal circulation cavity. A first valve group is disposed between an inlet of the compressor and an outlet of the evaporator. When the first heat exchange mode is used for heat exchange, the outlet of the evaporator is communicated with the inlet of the compressor by using the first valve group.

The evaporator is configured to cool down hot air flowing to a surface of the evaporator, and the hot air on the surface of the evaporator heats up a heat exchange working medium inside the evaporator. The compressor is configured to compress a heat exchange working medium flowing into the compressor.

The evaporator is located in the internal circulation cavity to cool down hot air in the internal circulation cavity. The compressor is located in the internal circulation cavity, and the inlet of the compressor is communicated with or closed from the outlet of the evaporator by using the first valve group. When the inlet of the compressor is communicated with the outlet of the evaporator by using the first valve group, the heat exchange working medium inside the evaporator absorbs heat and becomes a gaseous heat exchange working medium when the evaporator cools down the hot air in the internal circulation cavity, and the gaseous heat exchange working medium flows to the compressor. When the inlet of the compressor is closed from the outlet of the evaporator by using the first valve group, the gaseous heat exchange working medium cannot flow to the compressor.

When the first heat exchange mode is used for heat exchange, the heat exchange working medium in the evaporator absorbs heat and becomes gas, and flows into the compressor. The compressor compresses the gaseous heat exchange working medium to allow the gaseous heat exchange working medium to become a high-temperature and high-pressure heat exchange working medium. The high-temperature and high-pressure heat exchange working medium flows into the condenser, to perform heat exchange circulation. By using the first heat exchange mode, indoor temperature can be lower than outdoor temperature, and a refrigeration effect is better. In addition, the indoor temperature can be controlled according to a requirement, and refrigeration precision can be improved.

When the first heat exchange mode does not work, the compressor does not work neither. When the compressor is disposed in the internal circulation cavity, a temperature difference between the compressor and the evaporator is small, and the gaseous heat exchange working medium in the evaporator does not enter the compressor in a large quantity, thereby reducing a slugging risk of the compressor. If the compressor is disposed in the external circulation cavity, when the heat exchange device is switched to a second heat exchange mode, temperature of the external circulation cavity is low, so that temperature of the compressor is lower than temperature of the evaporator, and there is a large pressure difference between the evaporator and the compressor. The gaseous heat exchange working medium in the evaporator continuously leaks into the compressor. Yet the compressor does not work, and the gaseous heat exchange working medium is cooled down and stored in the compressor. When the heat exchange device is switched to the first heat exchange mode, and when the compressor starts again, the compressor cannot continue to compress a liquid heat exchange working medium stored in the compressor, resulting in the slugging risk that may damage the compressor. In this application, the compressor is disposed in the internal circulation cavity to reduce the slugging risk of the compressor.

In one embodiment, the heat exchange device further has the second heat exchange mode, and the heat exchange device further includes a condenser. The condenser is located in the external circulation cavity, an inlet of the condenser is communicated with an outlet of the compressor, the first valve group is further located between the inlet of the condenser and the outlet of the evaporator, and an outlet of the condenser is communicated with an inlet of the evaporator. When the second heat exchange mode is used for heat exchange, the outlet of the evaporator is communicated with the inlet of the condenser by using the first valve group.

When the second heat exchange mode is used for heat exchange, the compressor does not work, the evaporator is communicated with the condenser, and the heat exchange working medium in the evaporator becomes the gaseous heat exchange working medium after performing heat exchange with indoor hot air. The gaseous heat exchange working medium flows into the condenser, and the gaseous heat exchange working medium is cooled down by the condenser to become the liquid heat exchange working medium. The liquid heat exchange working medium flows back to the evaporator. The second heat exchange mode may be applicable to a scenario with a lower requirement for heat exchange effect. When the outlet of the evaporator is communicated with the inlet of the compressor by using the first valve group, the compressor is located in the internal circulation cavity in this application, so that the temperature difference between the compressor and the evaporator is small. In the second heat exchange mode, the gaseous heat exchange working medium in the evaporator does not enter the compressor in a large quantity, thereby reducing the slugging risk of the compressor. When the outlet of the evaporator is closed from the inlet of the compressor by using the first valve group, the gaseous heat exchange working medium in the evaporator cannot enter the compressor, so that all the heat exchange working media flow between the evaporator and the condenser, thereby improving a heat exchange capability of the heat exchange device and protecting the compressor.

In one embodiment, from the ground, a height of the condenser is greater than a height of the evaporator. In this way, in the second heat exchange mode, the liquid heat exchange working medium in the condenser can quickly flow back to the evaporator under action of gravity, thereby improving working efficiency of the heat exchange working medium.

In one embodiment, the housing includes a first side plate and a second side plate that are oppositely disposed along a second direction, the partition plate is located between the first side plate and the second side plate, the partition plate includes a main plate and a branching plate that are connected to each other, the branching plate protrudes from the main plate to the second side plate, and the compressor and the evaporator are located between the branching plate and the first side plate in the second direction.

The branching plate is disposed in a protruding manner towards one side of the main plate to increase space of the internal circulation cavity, to accommodate the compressor and the evaporator. In another implementation, a shape and a size of the partition plate may be set according to a component and a pipeline in the heat exchange device, so that the housing can be divided into the internal circulation cavity and the external circulation cavity, and the internal circulation cavity can accommodate the compressor and the evaporator.

In one embodiment, the compressor and the evaporator are disposed adjacent to a bottom plate of the housing, and are placed on the bottom plate. The compressor and the evaporator are disposed side by side along the second direction, and occupy a large part of a volume below the housing. An upper main plate is configured to separate a large part of space above the housing. The branching plate is disposed in a protruding manner, so that a large part of space below the housing is used as part of the internal circulation cavity and is configured to accommodate the compressor and the evaporator.

In one embodiment, the main plate and the branching plate are of an integrated structure. The integrated structure enables structural strength of the partition plate to be higher. In some implementations, the main plate and the branching plate may be of a split structure, and the main plate and the branching plate are fastened by using a screw or adhesive or through welding.

In one embodiment, the housing includes a first side plate and a bottom plate, the first side plate intersects and is connected to the bottom plate, and the first side plate is located on a side that is of the evaporator and that is away from the partition plate, there is a first gap between the evaporator and the first side plate, and there is a second gap between the evaporator and the bottom plate.

The first side plate is located on a side that is of the evaporator and that is away from the partition plate. The first side plate may directly face the side that is of the evaporator and that is away from the partition plate along a second direction Y, or the first side plate may not directly face the partition plate. When the evaporator cools down indoor hot air H, condensate water is generated on a surface of the evaporator. The condensate water flows downward from the surface of the evaporator. The first gap and the second gap are disposed, so that the condensate water on the surface of the evaporator can be prevented from being blown into an indoor environment through a first air exhaust vent on the first side plate. If the condensate water is blown into an indoor side by a first fan, performance of an indoor electronic device is affected.

In one embodiment, the evaporator includes a liquid collecting pipe and a fin assembly, there is a through hole between the fin assembly and the liquid collecting pipe, the heat exchange device further includes a wind blocking structure, and the wind blocking structure covers at least an opening at one end of the through hole. In one embodiment, the wind blocking structure covers an opening at one end that is of the through hole and that is away from the first side plate. In another implementation, the wind blocking structure may cover openings at two ends of the through hole. The through hole is generally a processed through hole of the evaporator. The through hole is large in size. The wind blocking structure is configured to prevent an air flow from flowing through the through hole, to ensure that the air flow flows through the fin assembly, thereby improving heat exchange effect. In addition, the wind blocking structure can prevent a large air flow from blowing condensate water cooled down by the fin assembly to an outer side of the housing, which may affect performance of an indoor electronic device. The wind blocking structure may be structural adhesive, foam, sheet metal, or the like.

In one embodiment, the first valve group includes a first valve, and the first valve is connected between the inlet of the condenser and the outlet of the evaporator. When the second heat exchange mode is used for heat exchange, the inlet of the condenser is communicated with the outlet of the evaporator by using the first valve. In this way, the heat exchange working medium flows between the condenser and the evaporator. In one embodiment, when the first heat exchange mode is used for heat exchange, the inlet of the condenser is closed from the outlet of the evaporator by using a first valve. The compressor and the condenser keep being in a communicated state, and the compressor and the evaporator keep being in a communicated state. In the first heat exchange mode, the inlet of the condenser is closed from the outlet of the evaporator by using the first valve. In this case, the heat exchange working medium can flow into the condenser only by using the compressor. When the second heat exchange mode is used for heat exchange, the compressor does not work, and the compressor is disposed in the internal circulation cavity, so that the heat exchange working medium directly flows from the evaporator to the condenser. In one embodiment, the first valve is a two-way valve, and the evaporator is communicated with or closed from the condenser by using the two-way valve. In another implementation, the first valve may also be a valve formed by another structure, provided that the evaporator can be communicated with or closed from the condenser. This is not limited herein.

In one embodiment, the first valve group further includes a second valve and a third valve, the second valve is connected between the outlet of the evaporator and the inlet of the compressor, and the third valve is connected between the outlet of the compressor and the inlet of the condenser. When the first heat exchange mode is used for heat exchange, the outlet of the evaporator is communicated with the inlet of the compressor by using the second valve, and the outlet of the compressor is communicated with the inlet of the condenser by using the third valve. In this way, the heat exchange working medium flows between the evaporator and the compressor, and between the compressor and the condenser.

In one embodiment, when the second heat exchange mode is used for heat exchange, the inlet of the evaporator is closed from the outlet of the compressor by using the second valve, the outlet of the compressor is closed from the inlet of the condenser by using the third valve, and the inlet of the condenser is communicated with the outlet of the evaporator by using the first valve. When the second heat exchange mode is used for heat exchange, the second valve and the third valve are closed, to prevent the heat exchange working medium in the evaporator from flowing into the compressor, thereby improving heat exchange efficiency of a heat pipe and protecting the compressor.

In one embodiment, the first valve group further includes a fourth valve, the first valve is further connected between the outlet of the evaporator and the inlet of the compressor, and the fourth valve is connected between the outlet of the compressor and the inlet of the condenser. When the first heat exchange mode is used for heat exchange, the outlet of the evaporator is communicated with the inlet of the compressor by using the first valve, and the outlet of the compressor is communicated with the inlet of the condenser by using the fourth valve. In this way, the heat exchange working medium flows between the evaporator and the compressor, and between the compressor and the condenser.

In one embodiment, when the second heat exchange mode is used for heat exchange, the inlet of the evaporator is closed from the outlet of the compressor by using the first valve, and the outlet of the compressor is closed from the inlet of the condenser by using the fourth valve. The first valve is used to control the evaporator to be communicated with or closed from the condenser, and the evaporator to be communicated with or closed from the compressor, thereby reducing design space. This may be applicable to more application scenarios.

In one embodiment, the first valve group further includes a fifth valve, the first valve is further connected between the outlet of the compressor and the inlet of the condenser, and the fifth valve is connected between the outlet of the evaporator and the inlet of the compressor. When the first heat exchange mode is used for heat exchange, the outlet of the evaporator is communicated with the inlet of the compressor by using the fifth valve, and the outlet of the compressor is communicated with the inlet of the condenser by using the first valve. In this way, the heat exchange working medium flows between the evaporator and the compressor, and between the compressor and the condenser.

In one embodiment, when the second heat exchange mode is used for heat exchange, the inlet of the evaporator is closed from the outlet of the compressor by using the fifth valve, and the outlet of the compressor is closed from the inlet of the condenser by using the first valve. In one embodiment, the first valve is a three-way valve, and the fifth valve is a two-way valve. In one embodiment, the first valve is used to control the evaporator to be communicated with or closed from the condenser, and the compressor to be communicated with or closed from the condenser, thereby reducing design space. This may be applicable to more application scenarios.

In one embodiment, the first valve includes a first channel and a second channel that are disposed at an interval, and the first valve is further connected between the inlet of the compressor and the outlet of the compressor. When the first heat exchange mode is used for heat exchange, the outlet of the evaporator is communicated with the inlet of the compressor by using the first channel in the first valve, and the outlet of the compressor is communicated with the inlet of the condenser by using the second channel in the first valve. When the second heat exchange mode is used for heat exchange, the outlet of the evaporator is communicated with the inlet of the condenser by using the first channel in the first valve.

When the second heat exchange mode is used for heat exchange, the outlet of the evaporator is communicated with the inlet of the condenser by using the first channel of the first valve, and the inlet of the compressor is communicated with the outlet of the compressor by using the second channel of the first valve. A flow path of the heat exchange working medium is: the evaporator, the first channel, and the condenser. The first channel and the second channel may be connected to different paths by rotating the first valve. For example, when the first heat exchange mode is used for heat exchange, a position of the first valve is shown in the figure. When the first heat exchange mode is switched to the second heat exchange mode, the first valve is rotated clockwise, so that the first channel is connected between the evaporator and the condenser. The first valve having the first channel and the second channel is used to control a flow path of the heat exchange working medium in the first heat exchange mode and the second heat exchange mode, thereby reducing design space. This may be applicable to more application scenarios.

In one embodiment, the first valve group further includes a sixth valve, and the sixth valve is connected between the inlet of the compressor and the outlet of the compressor. In one embodiment, the sixth valve is a bypass valve. When a heat exchange requirement is low, that is, when an excessively high refrigerating capacity is not needed, and the compressor still has an excessively high refrigerating capacity when running at a minimum speed, the sixth valve is opened to allow some heat exchange working media to flow back to the compressor. In this way, the heat exchange working medium flowing to the condenser is reduced, and an actual capability of the compressor to drive the heat exchange working medium is reduced, so that a refrigerating capacity of the heat exchange device matches a required refrigerating capacity.

In one embodiment, an opening degree of the sixth valve may be adjusted. When a required refrigerating capability decreases, the opening degree of the sixth valve may be increased, to reduce the heat exchange working medium flowing to the condenser. When the required refrigerating capability increases, the opening degree of the sixth valve may be decreased until the sixth valve is completely closed.

In one embodiment, a second valve group includes a third channel and a fourth channel, and a through-flow cross-sectional area of the third channel is greater than a through-flow cross-sectional area of the fourth channel. When the first heat exchange mode is used for heat exchange, the outlet of the condenser is communicated with the inlet of the evaporator by using the fourth channel. When the second heat exchange mode is used for heat exchange, the outlet of the condenser is communicated with the inlet of the evaporator by using the third channel.

The through-flow cross-sectional area of the third channel is greater than the through-flow cross-sectional area of the fourth channel, so that flow resistance of the third channel is less than flow resistance of the fourth channel. In the second heat exchange mode, the heat exchange working medium absorbs heat and becomes a high-temperature and high-pressure heat exchange working medium. The high-temperature and high-pressure heat exchange working medium has flow power. The heat exchange working medium mainly provides the flow power based on a state of the heat exchange working medium, and the flow power is generally small. In this application, in the second heat exchange mode, the outlet of the condenser is communicated with the inlet of the evaporator by using the third channel. The flow resistance of the third channel is small, which is conducive to flow of the heat exchange working medium, and improves heat exchange efficiency in the second heat exchange mode. Specific through-flow cross-sectional areas of the third channel and the fourth channel may be set according to an actual requirement. The third channel may be switched to the fourth channel, or the fourth channel may be switched to the third channel by driving the second valve group to rotate or move. In one embodiment, a flow volume of the fourth channel may be controlled to implement precise flow adjustment in the first heat exchange mode.

In one embodiment, the second valve group is a two-segment electronic expansion valve or a ball valve with a notch groove. The two-segment electronic expansion valve or the ball valve with a notch groove can more accurately control switching between the first heat exchange mode and the second heat exchange mode, and can accurately control the flow adjustment in the first heat exchange mode.

In one embodiment, the second valve group is located in the internal circulation cavity. An environment inside the internal circulation cavity is safer, has less dust than that inside the external circulation cavity, and is free from wind and rain. In addition, the internal circulation cavity has no smoke that corrodes the second valve group, so that the second valve group has a longer service life and is not easily damaged. In some cases, the second valve group may alternatively be disposed in the external circulation cavity.

According to a second aspect, this application provides a heat exchange system. The heat exchange system includes an accommodation room, a heat source, and the heat exchange device according to any one of the foregoing descriptions. The heat source is located in the accommodation room, the internal circulation cavity in the heat exchange device is communicated with the accommodation room, and the heat exchange device is configured to dissipate heat for the heat source. The heat exchange device in this application is applied to the heat exchange system, so that a slugging risk of the heat exchange device is reduced, and a first heat exchange mode and a second heat exchange mode can be integrated. In this way, heat exchange effect of the heat exchange device can be improved, and the heat exchange device can meet a plurality of heat exchange requirements in the heat exchange system and be applicable to more heat exchange scenarios. The first heat exchange mode and the second heat exchange mode share the condenser and the evaporator, so that the heat exchange device is light in weight, small in size, and low in cost. When the heat exchange device is applied to the heat exchange system, a volume of the heat exchange system may be reduced and installation is facilitated. In addition, the compressor is disposed in the internal circulation cavity, so that a temperature difference between the compressor and the evaporator is small in the second heat exchange mode. In this way, the heat exchange working medium is prevented from flowing into the compressor, the slugging risk of the compressor is reduced, a service life of the heat exchange device is increased, and a maintenance cost is reduced. In addition, heat exchange efficiency of a heat pipe can be improved, thereby cooling down the heat exchange system, and improving working efficiency of the heat exchange device in the heat exchange system.

In one embodiment, the heat exchange device is installed on a side wall of the accommodation room. A hole is drilled on the side wall of the accommodation room, and the heat exchange device is embedded in the hole and fastened to the side wall. This installation manner may reduce the volume of the heat exchange system.

In one embodiment, the heat exchange system is a cabinet, a container, or a data center. When the heat exchange system is the cabinet, the accommodation room is a housing of the cabinet, and the heat exchange device is installed on a side wall of the housing of the cabinet.

In one embodiment, the heat source is a server, a baseband processing unit, a lithium battery, a power supply, or the like. The power supply refers to a switching power supply, and is configured to rectify an alternating current mains supply to a direct current, to supply power to an electric device. The lithium battery can be a single battery or a battery pack. The lithium battery is independently configured to supply power to an electric device in case of a mains outage. The lithium battery is further used in a photovoltaic energy storage scenario to store energy during daytime and discharge at night.

BRIEF DESCRIPTION OF DRAWINGS

To describe technical solutions in embodiments of this application more clearly, the following describes the accompanying drawings used in embodiments of this application.

DESCRIPTION OF EMBODIMENTS

The following describes the technical solutions in embodiments of this application with reference to the accompanying drawings in embodiments of this application. It is clearly that the described embodiments are merely some rather than all of embodiments of this application.

The terms "first", "second", and the like in this specification are merely intended for a purpose of description, and shall not be understood as an indication or implication of relative importance or implicit indication of a quantity of indicated technical features. Therefore, a feature limited by "first" or "second" may explicitly or implicitly include one or more features. In description of this application, unless otherwise stated, "a plurality of" means two or more than two.

In addition, in this specification, position terms such as "up" and "down" are defined relative to positions of structures in the accompanying drawings. It should be understood that these position terms are relative concepts used for relative description and clarification, and may correspondingly change according to changes in the positions of the structures.

This application provides a heat exchange device that has a first heat exchange mode. The heat exchange device includes a housing, a partition plate, an evaporator, and a compressor. The partition plate divides space inside the housing into an internal circulation cavity and an external circulation cavity. The internal circulation cavity is configured to be communicated with an indoor environment, and the external circulation cavity is configured to be communicated with an outdoor environment. The evaporator is located in the internal circulation cavity. The compressor is located in the internal circulation cavity, and a first valve group is disposed between an inlet of the compressor and an outlet of the evaporator. When the first heat exchange mode is used for heat exchange, the outlet of the evaporator is communicated with the inlet of the compressor by using the first valve group. The heat exchange device provided in this application has the compressor disposed in the internal circulation cavity, so that a temperature difference between the compressor and the evaporator is small when the compressor does not work, thereby preventing the heat exchange working medium from flowing into the compressor and reducing a slugging risk of the compressor.

Figure 1:
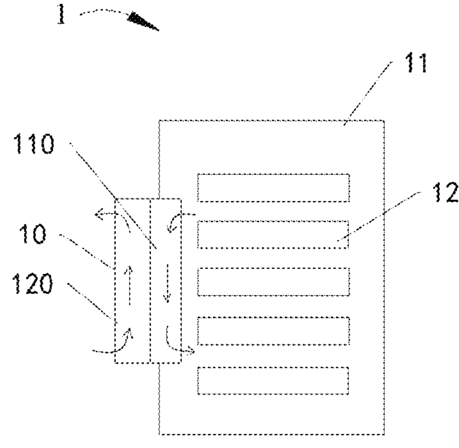
FIG. 1 is a schematic diagram of a structure of a heat exchange system according to an embodiment of this application.

FIG. 1 is a schematic diagram of a structure of a heat exchange system 1 according to one embodiment of this application. The heat exchange system 1 includes an accommodation room 11, a heat source 12, and a heat exchange device 10. The heat source 12 is located in the accommodation room 11, an internal circulation cavity 110 in the heat exchange device 10 is communicated with the accommodation room 11, and the heat exchange device 10 is configured to dissipate heat for the heat source 12. The heat source 12 generates heat when working. The accommodation room 11 is communicated with the internal circulation cavity 110. The heat exchange device 10 drives hot air in the accommodation room 11 to the internal circulation cavity 110, cools down the hot air, and allows the hot air to become cold air. The cold air flows back to the accommodation room 11 to cool down the heat source 12.

In this implementation, the heat exchange device 10 is installed on a side wall of the accommodation room 11. A hole is drilled on the side wall of the accommodation room 11, and the heat exchange device 10 is embedded in the hole and fastened to the side wall. This installation manner may reduce a volume of the heat exchange system 1. An air intake vent and an air exhaust vent are disposed on a side wall that is of the internal circulation cavity 110 and that faces the heat source 12. The air intake vent and the air exhaust vent are directly disposed opposite to the accommodation room 11. The accommodation room 11 implements air circulation with the internal circulation cavity 110 by using the air intake vent and the air exhaust vent. An air intake vent and an air exhaust vent are also disposed on a side wall that is of an external circulation cavity 120 and that is away from the heat source 12. The air intake vent and the air exhaust vent are disposed facing the outside, and are communicated with the outside, to implement air circulation between the external circulation cavity 120 and the outside.

In one embodiment, the heat exchange system 1 is a cabinet, a container, or a data center. When the heat exchange system 1 is the cabinet, the accommodation room 11 is a housing of the cabinet, and the heat exchange device 10 is installed on a side wall of the housing of the cabinet.

In one embodiment, the heat source is a server, a baseband processing unit, a lithium battery, a power supply, or the like. The power supply refers to a switching power supply, and is configured to rectify an alternating current mains supply to a direct current, to supply power to an electric device. The lithium battery can be a single battery or a battery pack. The lithium battery is independently configured to supply power to an electric device in case of a mains outage. The lithium battery is further used in a photovoltaic energy storage scenario to store energy during daytime and discharge at night.

For example, the heat exchange system 1 is a cabinet. When the heat source 12 is a server, the server works and generates heat. Continuous high temperature reduces a service life of the server, and even causes the server to break down or be damaged. Therefore, the cabinet needs to have a good heat dissipation capability. The heat exchange device 10 in this application can be used to improve the heat dissipation capability of the cabinet, so that the server can work normally and has a long service life.

In some implementations, the heat exchange device 10 may be located outside the accommodation room 11, or may be located inside the accommodation room 11. The heat exchange device 10 may be specifically disposed according to a size of the heat exchange system 1 and a heat exchange requirement.

Figure 2A:
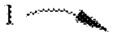
FIG. 2*a* is a schematic diagram of a structure of a heat exchange system according to an embodiment of this application.
Figure 2A:
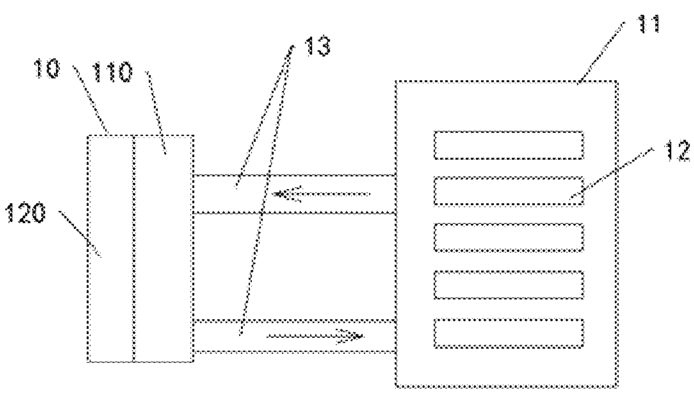

For example, as shown in FIG. 2*a*, the heat exchange device 10 is located outside the accommodation room 11. The internal circulation cavity 110 of the heat exchange device 10 is communicated with the accommodation room 11 by using a first air duct 13, so that air circulation is implemented between the internal circulation cavity 110 and the accommodation room 11. The external circulation cavity 120 of the heat exchange device 10 has an opening and is communicated with the outdoor environment. When the heat exchange device 10 is located outside the accommodation room 11, the heat exchange device 10 is applicable to a heat exchange system 1 with a small size. For example, the heat exchange system 1 is a cabinet or a container, and the accommodation room 11 may be an outer housing of the cabinet or a container housing of the container.

Figure 2B:
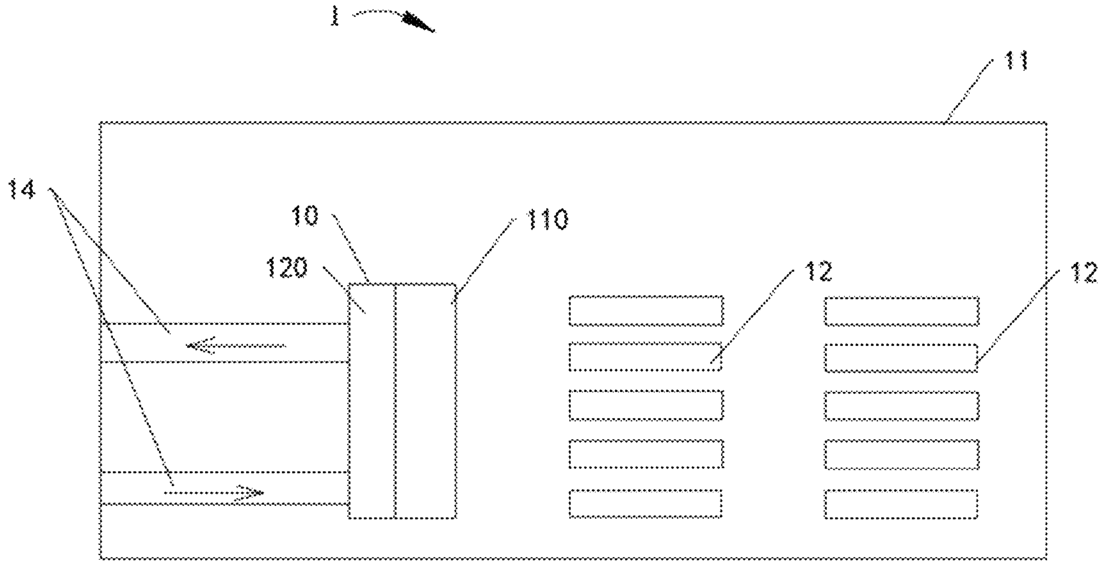
FIG. 2*b* is a schematic diagram of a structure of a heat exchange system according to an embodiment of this application.

As shown in FIG. 2*b*, for example, when the heat exchange device 10 is located inside the accommodation room 11, the internal circulation cavity 110 of the heat exchange device 10 has an opening and is communicated with the accommodation room 11. The external circulation cavity 120 of the heat exchange device 10 is communicated with the outdoor environment by using a second air duct 14, so that external air circulation is implemented between the external circulation cavity 120 and the outdoor environment. When the heat exchange device 10 is located inside the accommodation room 11, the heat exchange device 10 is applicable to a heat exchange system 1 with a large size. For example, the heat exchange system 1 is a data center, and the accommodation room 11 may be an equipment room of the data center.

For example, the heat exchange system 1 is a data center. Generally, there is a plurality of servers in the data center. These servers generate a large amount of heat when working. A plurality of heat exchange devices 10 may be disposed according to a requirement, to jointly improve heat dissipation effect of the data center and improve data processing efficiency of the data center. When the heat exchange system 1 is a cabinet or a container, a plurality of heat exchange devices 10 may also be disposed according to a requirement.

The following specifically describes a heat exchange device 10 provided in this application with reference to the accompanying drawings and specific implementations.

Figure 3:
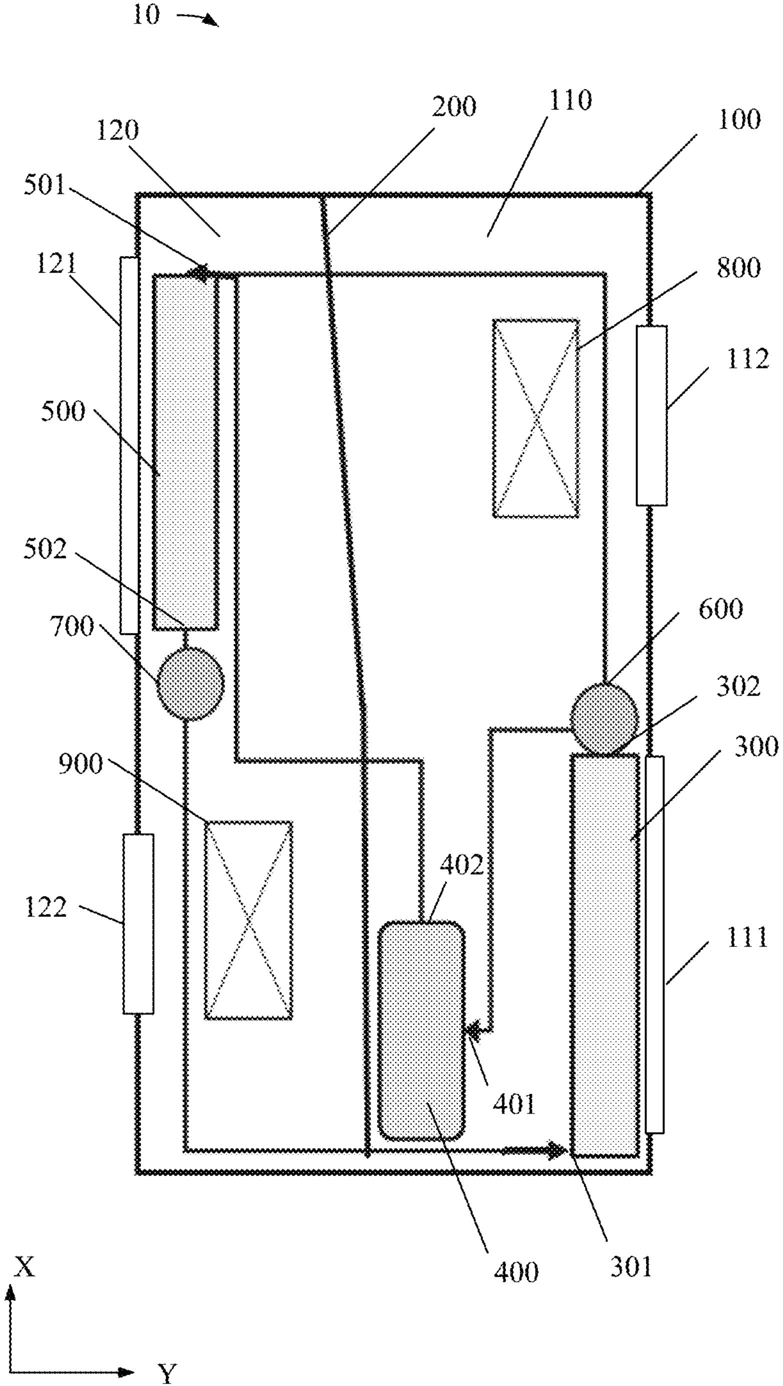
FIG. 3 is a schematic diagram of a structure of a heat exchange device according to an embodiment of this application.

FIG. 3 is a schematic diagram of a structure of the heat exchange device 10 according to one embodiment of this application. The heat exchange device 10 has a first heat exchange mode and a second heat exchange mode. The heat exchange device 10 includes a housing 100, a partition plate 200, an evaporator 300, a compressor 400, a condenser 500, a first valve group 600, a second valve group 700, a first fan 800, and a second fan 900. The evaporator 300 is configured to cool down hot air flowing to a surface of the evaporator 300, and the hot air on the surface of the evaporator 300 heats up a heat exchange working medium inside the evaporator 300. The compressor 400 is configured to compress a heat exchange working medium flowing into the compressor 400. The condenser 500 is configured to heat up cold air flowing to a surface of the condenser 500, and the cold air on the surface of the condenser 500 cools down a heat exchange working medium inside the condenser 500.

The evaporator 300, the condenser 500, a pipeline between the evaporator 300 and the condenser 500, the first fan 800, and the second fan 900 are configured to cooperate to implement the second heat exchange mode. The evaporator 300, the compressor 400, the condenser 500, a pipeline among the evaporator 300, the compressor 400, and the condenser 500, the first fan 800, and the second fan 900 are configured to cooperate to implement the first heat exchange mode. The first heat exchange mode is also referred to as an air conditioner heat exchange mode, and the second heat exchange mode is also referred to as a heat pipe heat exchange mode.

The partition plate 200 divides space inside the housing 100 into an internal circulation cavity 110 and an external circulation cavity 120. The internal circulation cavity 110 is configured to be communicated with an indoor environment, and the external circulation cavity 120 is configured to be communicated with an outdoor environment. For example, the internal circulation cavity 110 is communicated with the inside of an accommodation room 11, and the external circulation cavity 120 is communicated with the outside of the accommodation room 11.

In one embodiment, the first fan 800 is located in the internal circulation cavity 110. The first fan 800 is configured to implement internal circulation. The first fan 800 drives indoor hot air to enter the internal circulation cavity 110, and the hot air flows into the indoor environment after being cooled down in the internal circulation cavity 110, to implement internal circulation.

Figure 4:
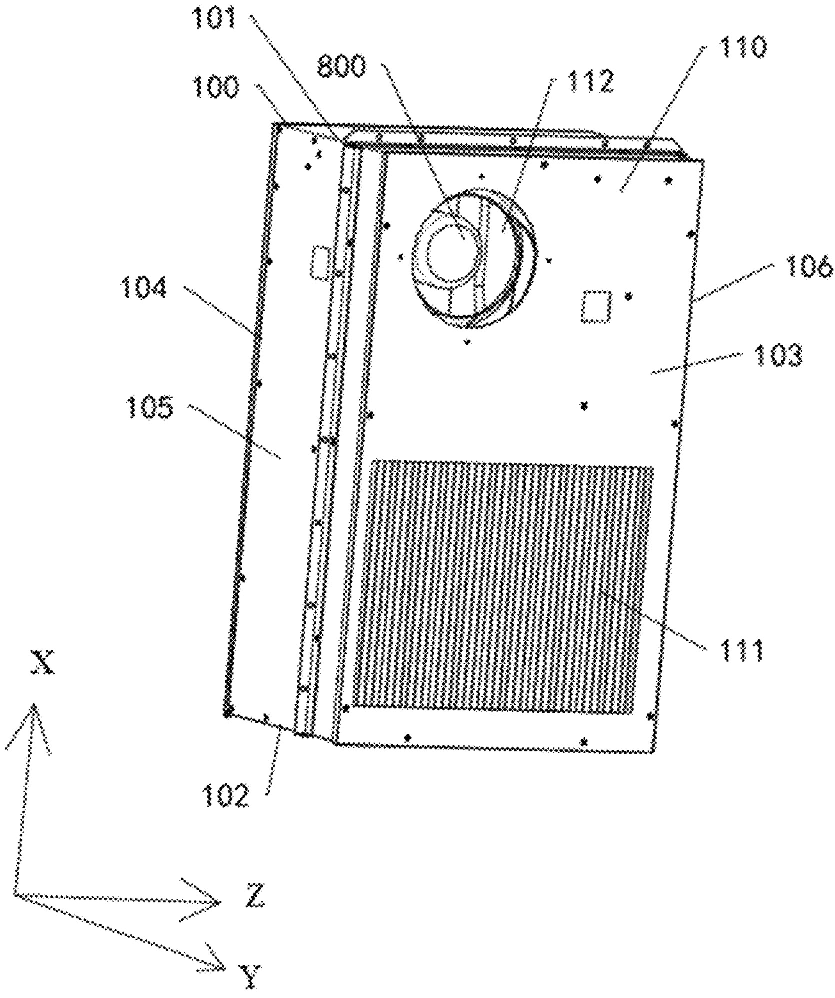
FIG. 4 is a schematic diagram of a structure of a heat exchange device according to an embodiment of this application.

Refer to FIG. 3 and FIG. 4. In one embodiment, a first air exhaust vent 111 and a first air intake vent 112 are disposed on the internal circulation cavity 110. The first air exhaust vent 111 and the first air intake vent 112 are communicated with the indoor environment. The first fan 800 is located at the first air intake vent 112, and the first fan 800 is configured to drive indoor hot air to enter the internal circulation cavity 110 from the first air intake vent 112 and exhaust from the first air exhaust vent 111. For example, the first air exhaust vent 111 is located below the first air intake vent 112. The first fan 800 may be disposed at an installation position according to a layout in the internal circulation cavity 110. For example, the first fan 800 is located at the first air exhaust vent 111, or the first fan 800 is located at the first air intake vent 112.

In one embodiment, the second fan 900 is located in the external circulation cavity 120, and the second fan 900 is configured to implement internal circulation. The second fan 900 drives outdoor cool air to enter the external circulation cavity 120, and the cold air is heated up by absorbing heat of the condenser 500 in the external circulation cavity 120 and then flows into the outdoor environment, to implement external circulation.

Figure 5:
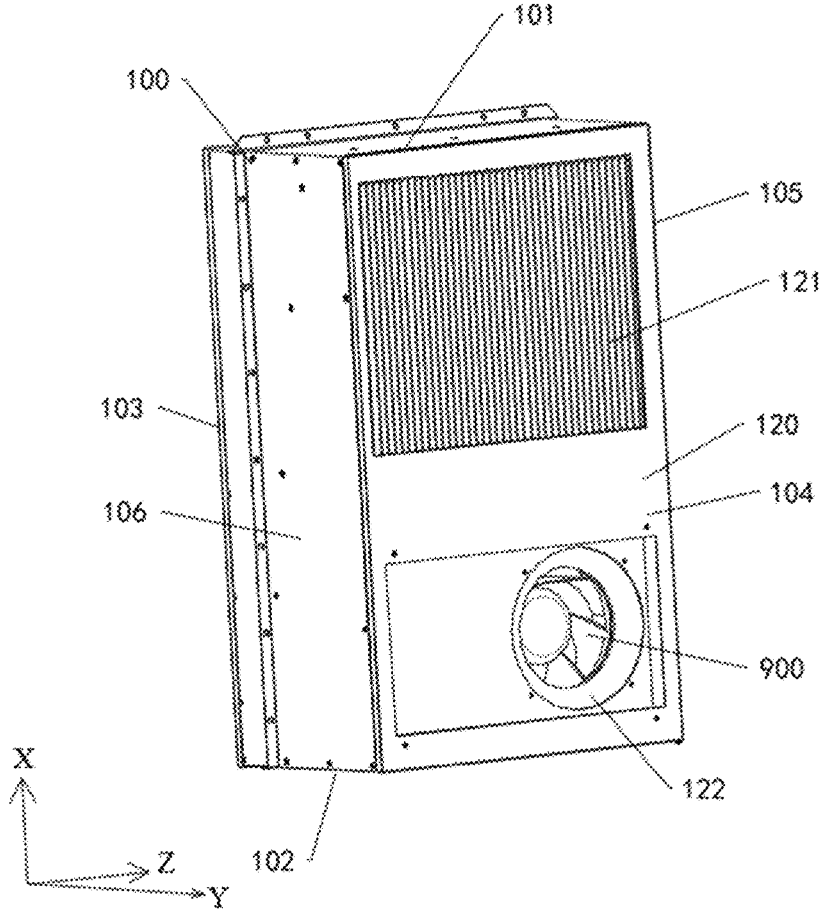
FIG. 5 is a schematic diagram of a structure of a heat exchange device according to an embodiment of this application.

Refer to FIG. 3 and FIG. 5. In one embodiment, a second air exhaust vent 121 and a second air intake vent 122 are disposed on the external circulation cavity 120, the second air exhaust vent 121 and the second air intake vent 122 are communicated with the outdoor environment, the second fan 900 is located at the second air intake vent 122, and the second fan 900 is configured to drive outdoor cool air to enter the external circulation cavity 120 from the second air exhaust vent 121 and exhaust from the second air intake vent 122. For example, the second air exhaust vent 121 is located above the second air intake vent 122. The second fan 900 may be disposed at an installation position according to a layout in the external circulation cavity 120. For example, the second fan 900 is located at the second air exhaust vent 121, or the second fan 900 is located at the second air intake vent 122.

The evaporator 300 is located in the internal circulation cavity 110 (as shown in FIG. 3), to cool down hot air in the internal circulation cavity 110. The compressor 400 is located in the internal circulation cavity 110, and an inlet 401 of the compressor 400 is communicated with or closed from an outlet 302 of the evaporator 300 by using the first valve group 600. When the inlet 401 of the compressor 400 is communicated with the outlet 302 of the evaporator 300 by using the first valve group 600, the heat exchange working medium inside the evaporator 300 absorbs heat and becomes a gaseous heat exchange working medium when the evaporator 300 cools down the hot air in the internal circulation cavity 110, and the gaseous heat exchange working medium flows to the compressor 400. When the inlet 401 of the compressor 400 is closed from the outlet 302 of the evaporator 300 by using the first valve group 600, the gaseous heat exchange working medium cannot flow to the compressor 400.

The condenser 500 is located in the external circulation cavity 120, an inlet 501 of the condenser 500 is communicated with an outlet 402 of the compressor 400. The inlet 501 of the condenser 500 is further communicated with or closed from the outlet 302 of the evaporator 300 by using the first valve group 600. An outlet 502 of the condenser 500 is communicated with an inlet 301 of the evaporator 300. When the inlet 501 of the condenser 500 is further communicated with the outlet 302 of the evaporator 300 by using the first valve group 600, the heat exchange working medium inside the evaporator 300 flows to the condenser 500 after being heated. When the inlet 501 of the condenser 500 is further closed from the outlet 302 of the evaporator 300 by using the first valve group 600, the heat exchange working medium in the evaporator 300 cannot flow to the condenser 500 after being heated.

When the first heat exchange mode is used for heat exchange, the compressor 400 works, the outlet of the evaporator 300 is communicated with the inlet of the compressor 400 by using the first valve group 600, the outlet of the compressor 400 is communicated with the inlet of the condenser 500, the outlet of the condenser 500 is communicated with the inlet of the evaporator 300, and the outlet of the evaporator 300 is closed from the inlet of the condenser 500 by using the first valve group 600.

Figure 6:
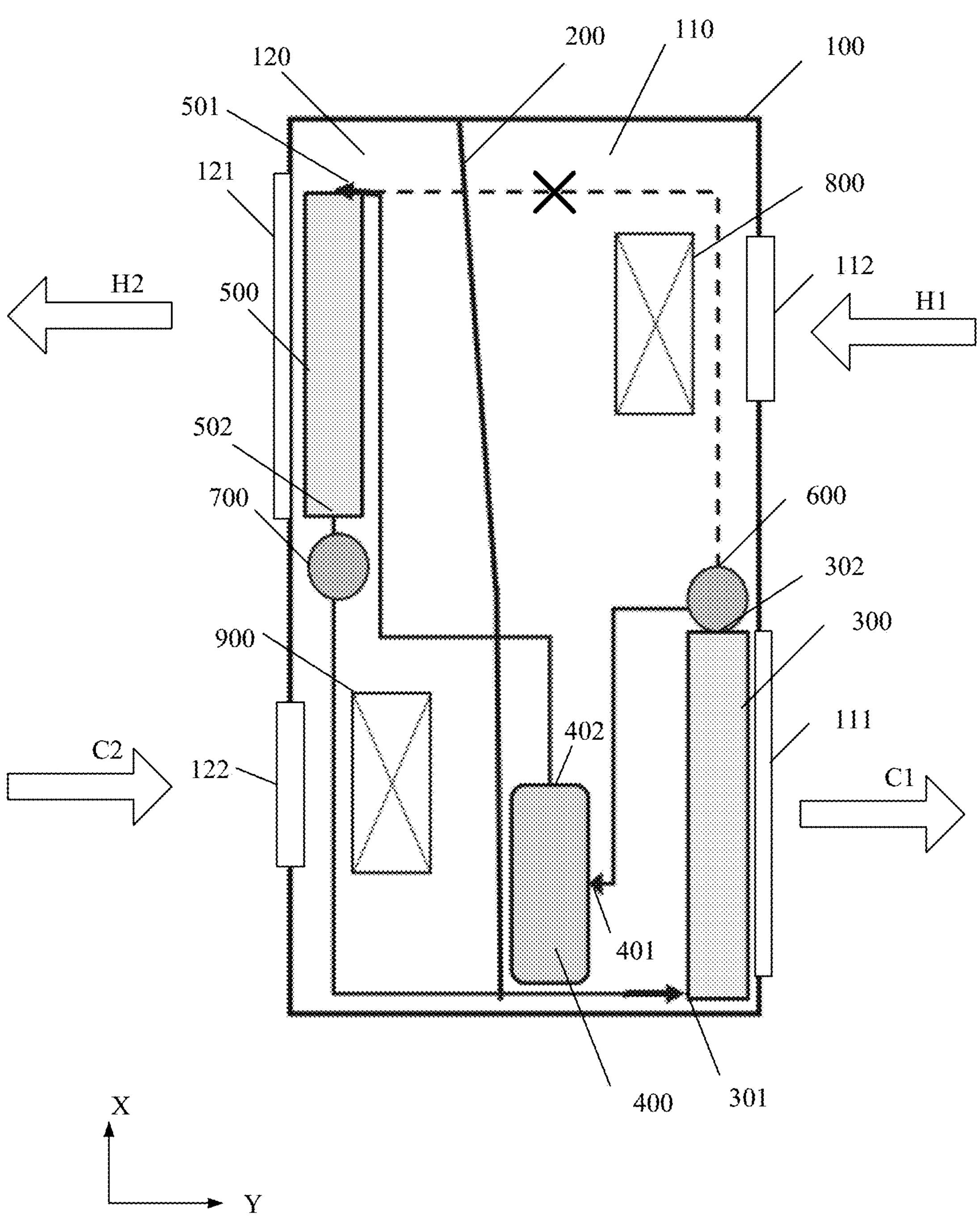
FIG. 6 is a schematic diagram of a heat exchange device in a first heat exchange mode according to an embodiment of this application.

As shown in FIG. 6, when the first heat exchange mode is used for heat exchange, the evaporator 300, the compressor 400, and the condenser 500 are connected in sequence. When the first fan 800 drives indoor hot air H1 to enter the internal circulation cavity 110, the hot air flows to a surface of the evaporator 300, the heat exchange working medium inside the evaporator 300 performs heat exchange with the hot air, and the indoor hot air H1 becomes indoor cold air C1 and enters the indoor environment, to cool down the indoor environment. The heat exchange working medium inside the evaporator 300 absorbs heat and becomes gas, and flows into the compressor 400. The compressor 400 compresses the gaseous heat exchange working medium to allow the gaseous heat exchange working medium to become a high-temperature and high-pressure heat exchange working medium. The high-temperature and high-pressure heat exchange working medium flows into the condenser 500. The second fan 900 drives outdoor cold air C2 to enter the external circulation cavity 120. The outdoor cold air C2 performs heat exchange with the high-temperature and high-pressure heat exchange working medium in the condenser 500. The outdoor cold air C2 heats up to become outdoor hot air H2 and is exhausted to the outdoor environment. The high-temperature and high-pressure heat exchange working medium in the condenser 500 becomes a low-temperature liquid heat exchange working medium. The liquid heat exchange working medium flows back to the evaporator 300 and continues to cool down the indoor hot air H1 through heat exchange. By using the first heat exchange mode, indoor temperature can be lower than outdoor temperature, and a refrigeration effect is better. In addition, the indoor temperature can be controlled according to a requirement, and refrigeration precision can be improved.

When the first heat exchange mode does not work, the compressor 400 does not work neither. When the compressor 400 is disposed in the internal circulation cavity 110, a temperature difference between the compressor 400 and the evaporator 300 is small, and the gaseous heat exchange working medium in the evaporator 300 does not enter the compressor 400 in a large quantity, thereby reducing a slugging risk of the compressor 400. If the compressor 400 is disposed in the external circulation cavity 120, when the heat exchange device 10 is switched to the second heat exchange mode, temperature of the external circulation cavity 120 is low, so that temperature of the compressor 400 is lower than temperature of the evaporator 300, and there is a large pressure difference between the evaporator 300 and the compressor 400. The gaseous heat exchange working medium in the evaporator 300 continuously leaks into the compressor 400. Yet the compressor 400 does not work, and the gaseous heat exchange working medium is cooled down and stored in the compressor 400. When the heat exchange device 10 is switched to the first heat exchange mode, and when the compressor 400 starts again, the compressor 400 cannot continue to compress the liquid heat exchange working medium stored in the compressor 400, resulting in the slugging risk that may damage the compressor 400.

When the second heat exchange mode is used for heat exchange, the first valve group 600 is further located between the outlet of the evaporator 300 and the inlet of the compressor 400, the outlet of the evaporator 300 is communicated with the inlet of the condenser 500 by using the first valve group 600, and the outlet of the condenser 500 is communicated with the inlet of the evaporator 300.

Figure 7:
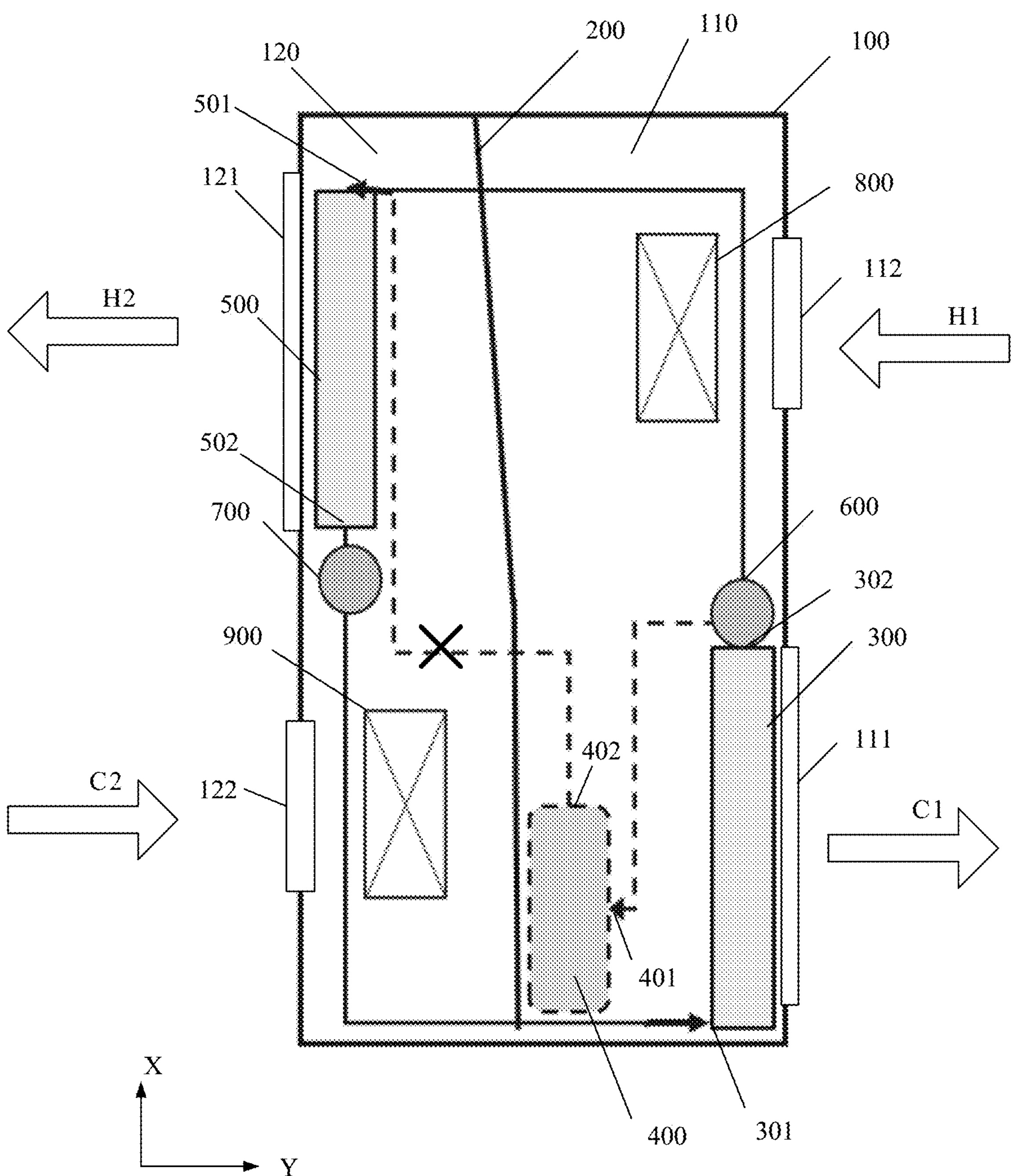
FIG. 7 is a schematic diagram of a heat exchange device in a second heat exchange mode according to an embodiment of this application.

As shown in FIG. 7, when the second heat exchange mode is used for heat exchange, the compressor 400 does not work, the evaporator 300 is communicated with the condenser 500, and the heat exchange working medium in the evaporator 300 becomes the gaseous heat exchange working medium after performing heat exchange with the indoor hot air H1. The gaseous heat exchange working medium flows into the condenser 500, and is cooled down by the condenser 500 to become the liquid heat exchange working medium. The liquid heat exchange working medium flows back to the evaporator 300. The second heat exchange mode may be applicable to a scenario with a lower requirement for heat exchange effect.

When the second heat exchange mode is used for heat exchange, and the outlet of the evaporator 300 is communicated with the inlet of the compressor 400 by using the first valve group 600, the compressor 400 is located in the internal circulation cavity 110 in this application, so that the temperature difference between the compressor 400 and the evaporator 300 is small. In the second heat exchange mode, the gaseous heat exchange working medium in the evaporator 300 does not enter the compressor 400 in a large quantity, thereby reducing the slugging risk of the compressor 400. If the compressor 400 is disposed in the external circulation cavity 120, when the heat exchange device 10 is switched to the second heat exchange mode, temperature of the external circulation cavity 120 is low, so that temperature of the compressor 400 is lower than temperature of the evaporator 300, and there is a large pressure difference between the evaporator 300 and the compressor 400. The gaseous heat exchange working medium in the evaporator 300 continuously leaks into the compressor 400. Yet the compressor 400 does not work, and the gaseous heat exchange working medium is cooled down and stored in the compressor 400. Finally, a heat exchange working medium that actually participates in heat exchange is reduced. That is, few heat exchange working medium flows between the evaporator 300 and the condenser 500. As a result, a heat exchange capability of the heat exchange device 10 cannot meet a requirement. In addition, when the heat exchange device 10 is switched to the first heat exchange mode, and when the compressor 400 starts again, the compressor 400 cannot continue to compress the liquid heat exchange working medium stored in the compressor 400, resulting in the slugging risk that may damage the compressor 400. Therefore, in this application, the compressor 400 is disposed in the internal circulation cavity 110, so that the temperature difference between the compressor 400 and the evaporator 300 is small, thereby reducing the slugging risk of the compressor 400, and ensuring heat exchange efficiency of the heat pipe.

When the second heat exchange mode is used for heat exchange, and when the outlet of the evaporator 300 is closed from the inlet of the compressor 400 by using the first valve group 600, the gaseous heat exchange working medium inside the evaporator 300 cannot enter the compressor 400, so that all the heat exchange working media flow between the evaporator 300 and the condenser 500, thereby improving a heat exchange capability of the heat exchange device 10 and protecting the compressor 400.

The heat exchange device 10 provided in this application, integrates the first heat exchange mode and the second heat exchange mode, so that heat exchange effect of the heat exchange device 10 can be improved, and the heat exchange device 10 can meet a plurality of heat exchange requirements and is applicable to more heat exchange scenarios. In addition, the first heat exchange mode and the second heat exchange mode share the condenser 500 and the evaporator 300, so that the heat exchange device 10 is light in weight, small in size, and low in cost. Moreover, the compressor 400 is disposed in the internal circulation cavity 110, so that the temperature difference between the compressor 400 and the evaporator 300 is small in the second heat exchange mode, thereby preventing the heat exchange working medium from flowing into the compressor 400, reducing the slugging risk of the compressor 400, and improving heat exchange efficiency of the heat pipe.

In one embodiment, from the ground, a height of the condenser 500 is greater than a height of the evaporator 300. In this way, in the second heat exchange mode, the liquid heat exchange working medium in the condenser 500 can quickly flow back to the evaporator 300 under action of gravity, thereby improving working efficiency of the heat exchange working medium.

Refer to FIG. 4 and FIG. 5. In one embodiment, the housing 100 includes a top plate 101 and a bottom plate 102 that are oppositely disposed along a first direction X, a first side plate 103 and a second side plate 104 that are oppositely disposed along a second direction Y, and a third side plate 105 and a fourth side plate 106 that are oppositely disposed along a third direction Z. The first side plate 103, the third side plate 105, the second side plate 104, and the fourth side plate 106 are sequentially connected. The top plate 101 and the bottom plate 102 are located at two ends of the first side plate 103, the third side plate 105, the second side plate 104, and the fourth side plate 106 along the first direction X. The first direction X, the second direction Y, and the third direction Z intersect each other. In this implementation, the first direction X, the second direction Y, and the third direction Z are perpendicular to each other. The first direction X is a height direction of the heat exchange device 10, the second direction Y is a width direction of the heat exchange device 10, and the third direction Z is a length direction of the heat exchange device 10. When the heat exchange device 10 works, the bottom plate 102 is disposed adjacent to the ground, and the top plate 101 is located above the bottom plate 102. In some implementations, the second direction Y is a length direction of the heat exchange device 10, and the third direction Z is a width direction of the heat exchange device 10.

In this implementation, the partition plate 200, the second side plate 104, and part of the top plate 101 and part of the bottom plate 102 between the partition plate 200 and the first side plate 103 are arranged to form the external circulation cavity 120, and the partition plate 200, the first side plate 103, and part of the top plate 101 and part of the bottom plate 102 between the partition plate 200 and the second side plate 104 are arranged to form the internal circulation cavity 110. The first air exhaust vent 111 and the first air intake vent 112 are disposed on the first side plate 103, and the second air exhaust vent 121 and the second air intake vent 122 are disposed on the second side plate 104. Sizes and shapes of the first air exhaust vent 111, the first air intake vent 112, the second air exhaust vent 121, and the second air intake vent 122 may be set according to a requirement. This is not limited herein.

Figure 8A:
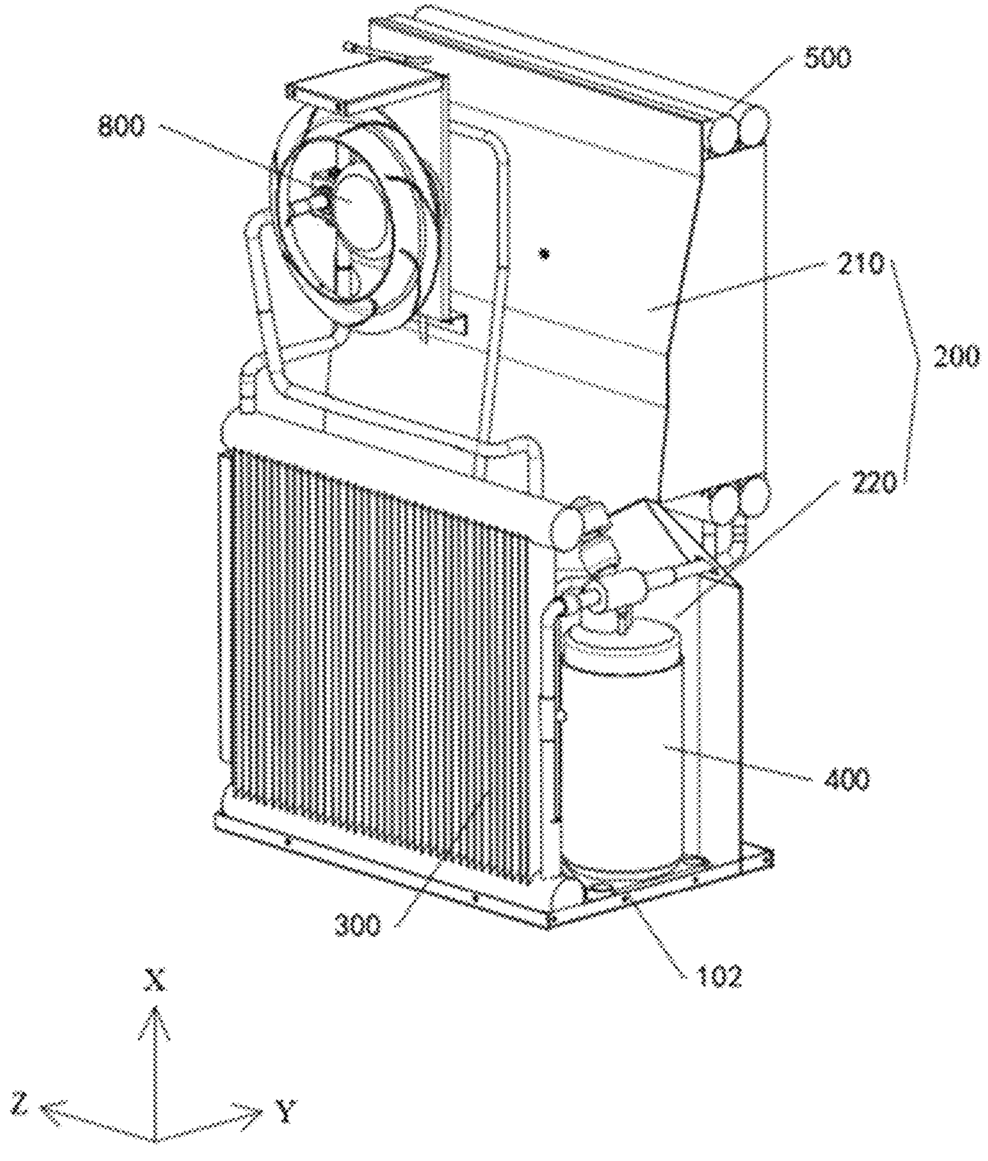
FIG. 8*a* is a schematic diagram of a structure of a heat exchange device according to an embodiment of this application.
Figure 8B:
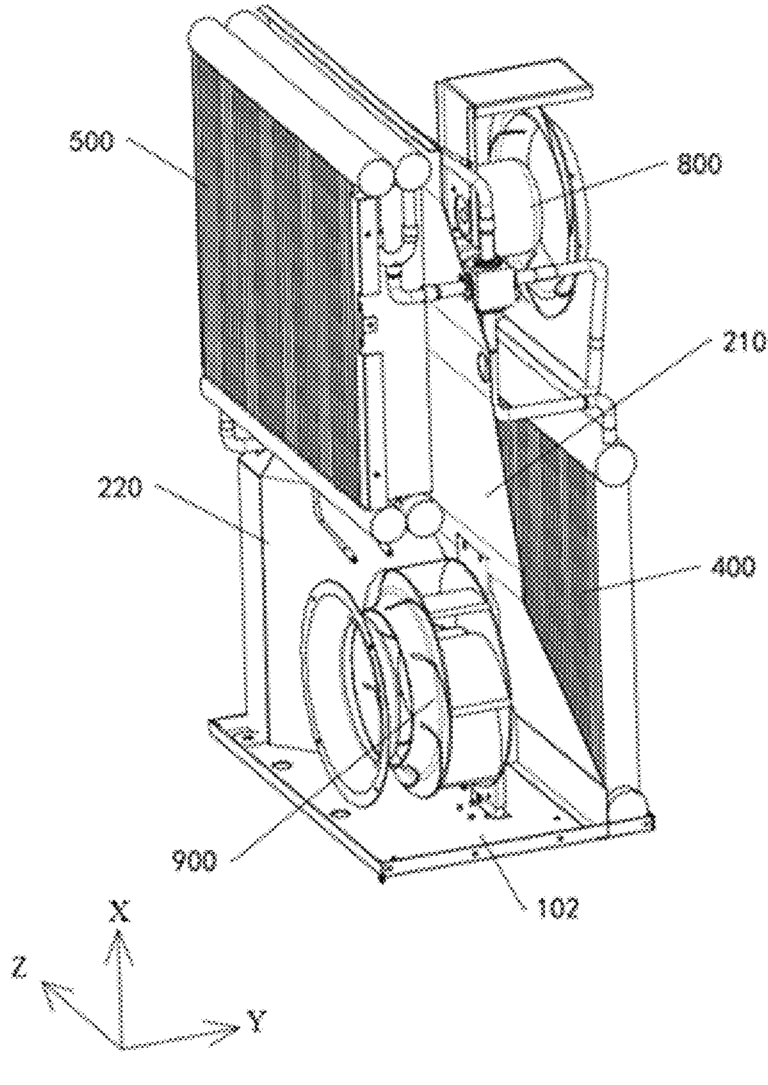
FIG. 8*b* is a schematic diagram of a structure of a heat exchange device according to an embodiment of this application.
Figure 9A:
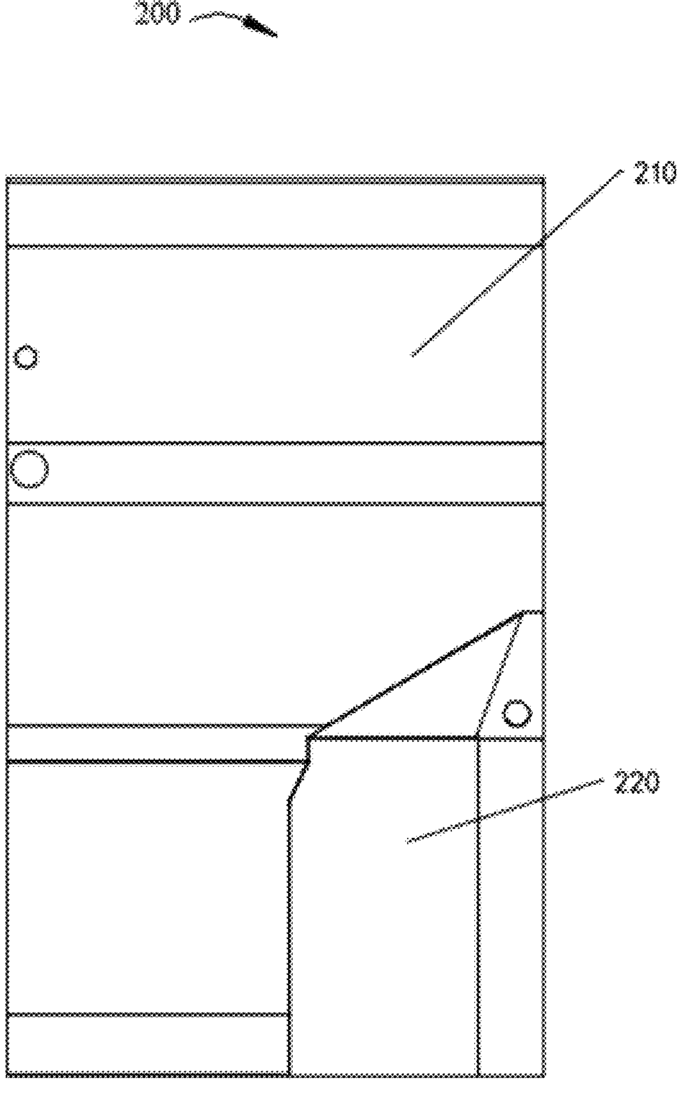
FIG. 9*a* is a schematic diagram of a structure of a partition plate in a heat exchange device according to an embodiment of this application.
Figure 9B:
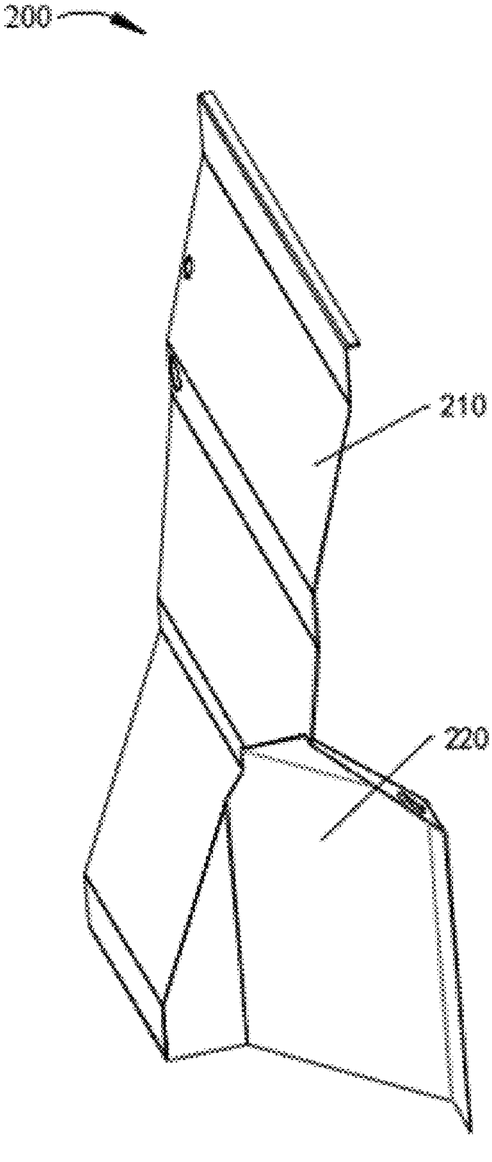
FIG. 9*b* is a schematic diagram of a structure of a partition plate in a heat exchange device according to an embodiment of this application.

FIG. 8*a* and FIG. 8*b* are schematic diagrams of structures of the heat exchange device 10 without the housing 100, and FIG. 9*a* and FIG. 9*b* are schematic diagrams of structures of the partition plate 200. In one embodiment, the partition plate 200 is located between the first side plate 103 and the second side plate 104. The partition plate 200 includes a main plate 210 and a branching plate 220 that are connected to each other. The branching plate 220 protrudes from the main plate 210 to the second side plate 104. The compressor 400 and the evaporator 300 are located between the branching plate 220 and the first side plate 103 in the second direction Y. In one embodiment, the compressor 400 and the evaporator 300 are arranged side by side along the second direction Y.

Refer to FIG. 8*a*. In this implementation, the compressor 400 and the evaporator 300 are disposed adjacent to the bottom plate 102, and are placed on the bottom plate 102. The compressor 400 and the evaporator 300 are disposed side by side along the second direction Y, and occupy a large part of a volume below the housing 100. The upper main plate 210 is configured to divide a large part of space above the housing 100. The branching plate 220 is disposed in a protruding manner, so that a large part of space below the housing 100 is used as part of the internal circulation cavity 110, and is configured to accommodate the compressor 400 and the evaporator 300.

In this implementation, the branching plate 220 is disposed in a protruding manner towards one side of the main plate 210 to increase space of the internal circulation cavity 110, to accommodate the compressor 400 and the evaporator 300. In another implementation, a shape and a size of the partition plate 200 may be set according to a component and a pipeline in the heat exchange device 10, so that the housing 100 can be divided into the internal circulation cavity 110 and the external circulation cavity 120, and the internal circulation cavity 110 can accommodate the compressor 400 and the evaporator 300.

Refer to FIG. 3, FIG. 8*a*, and FIG. 8*b*. In this implementation, the first fan 800 and the evaporator 300 are arranged along the first direction X, and the compressor 400 and the evaporator 300 are arranged along the second direction Y. The compressor 400 is disposed closer to the external circulation cavity 120 than the evaporator 300. The second fan 900 and the condenser 500 are arranged along the first direction X, the condenser 500 is located above the second fan 900, and the condenser 500 and the first fan 800 are arranged along the second direction, and are located above the second fan 900, the compressor 400, and the evaporator 300. Through such arrangement, components inside the housing 100 can be arranged compactly, a volume is reduced, and the heat exchange device 10 is miniaturized. In another implementation, internal components may be arranged according to a requirement.

In one embodiment, the main plate 210 and the branching plate 220 are of an integrated structure. The integrated structure enables higher structural strength of the partition plate 200 to be higher. In some implementations, the main plate 210 and the branching plate 220 may be of a split structure, and the main plate 210 and the branching plate 220 are fastened by using a screw or adhesive or through welding.

Figure 10:
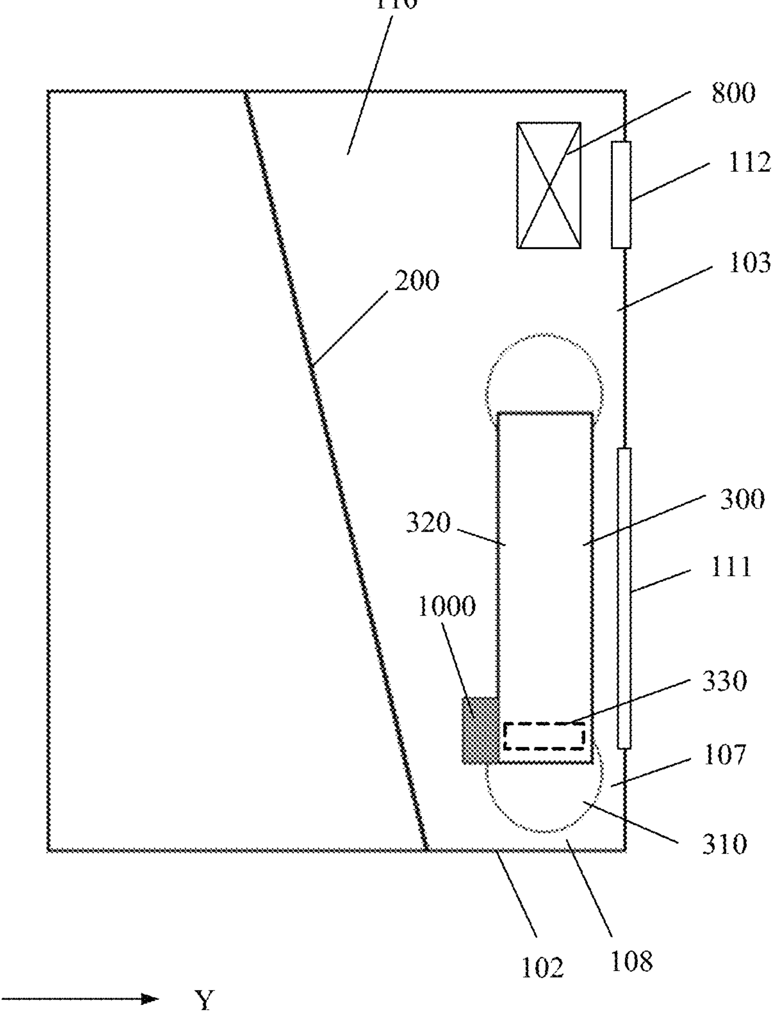
FIG. 10 is a schematic diagram of a structure of a heat exchange device according to an embodiment of this application.

Refer to FIG. 10. In one embodiment, the housing 100 includes the first side plate 103 and the bottom plate 102. The first side plate 103 intersects and is connected to the bottom plate 102. The first side plate 103 is located on a side that is of the evaporator 300 and that is away from the partition plate 200. There is a first gap 107 between the evaporator 300 and the first side plate 103, and there is a second gap 108 between the evaporator 300 and the bottom plate 102.

The first side plate 103 is located on a side that is of the evaporator 300 and that is away from the partition plate 200. The first side plate 103 may directly face the side that is of the evaporator 300 and that is away from the partition plate 200 along the second direction Y, or the first side plate 103 may not directly face the partition plate 200. When the evaporator 300 cools down the indoor hot air H1, condensate water is generated on the surface of the evaporator 300. The condensate water flows downward from the surface of the evaporator 300. The first gap 107 and the second gap 108 are disposed, so that the condensate water on the surface of the evaporator 300 can be prevented from being blown into the indoor environment through the first air exhaust vent 111 on the first side plate 103. If the condensate water is blown into an indoor side by a first fan 800, performance of an indoor electronic device is affected.

Figure 11:
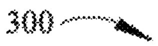
FIG. 11 is a schematic diagram of a structure of an evaporator in a heat exchange device according to an embodiment of this application.
Figure 11:
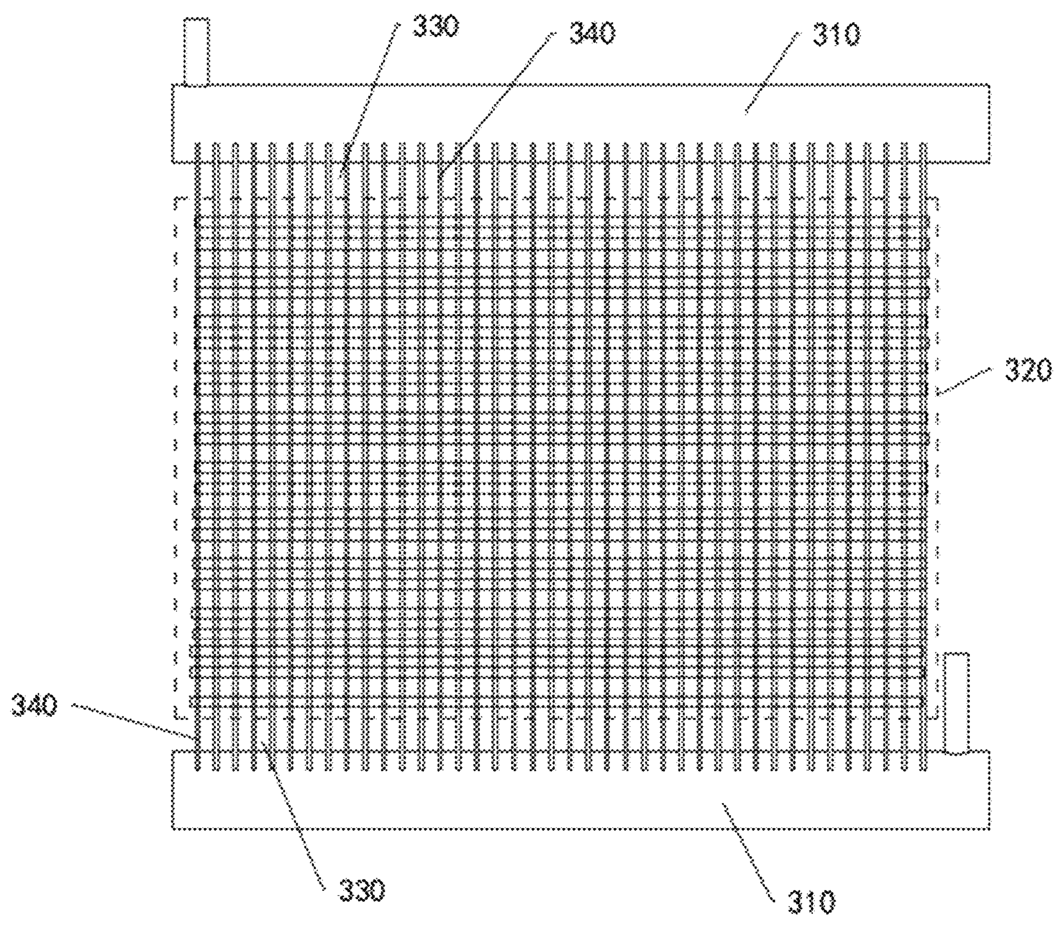

Refer to FIG. 10 and FIG. 11. In one embodiment, the evaporator 300 includes a liquid collecting pipe 310 and a fin assembly 320 (as shown in FIG. 11). There is a through hole 330 between the fin assembly 320 and the liquid collecting pipe 310. The heat exchange device 10 further includes a wind blocking structure 1000 (as shown in FIG. 10), and the wind blocking structure 1000 covers at least an opening at one end of the through hole 330. In FIG. 10, the wind blocking structure 1000 covers an opening at one end that is of the through hole 330 and that is away from the first side plate 103. In another implementation, the wind blocking structure 1000 may cover openings at two ends of the through hole 330. The through hole 330 is generally a processed through hole of the evaporator 300. The through hole is large in size. The wind blocking structure 1000 is configured to prevent an air flow from flowing through the through hole 330, to ensure that the air flow flows through the fin assembly 320, thereby improving heat exchange effect. In addition, the wind blocking structure 1000 can prevent a large air flow from blowing condensate water cooled down by the fin assembly 320 to an outer side of the housing 100, which may affect performance of an indoor electronic device. The wind blocking structure 1000 may be structural adhesive, foam, sheet metal, or the like.

When a size of the liquid collecting pipe 310 along the second direction Y is greater than a size of the fin assembly 320 along the second direction Y, the liquid collecting pipe 310 is closer to the first side plate 103 than the fin assembly 320. In this case, the first gap 107 is a gap between the liquid collecting pipe 310 and the first side plate 103, and a gap between the fin assembly 320 and the first side plate 103 is greater than the first gap 107. When the first gap is disposed between the liquid collecting pipe 310 and the first side plate 103, it can be ensured that there is a gap between the entire evaporator 300 and the first side plate 103, thereby preventing the condensate water from being blown into the indoor environment.

The evaporator 300 further includes a plurality of microchannel flat pipes 340. The plurality of microchannel flat pipes 340 are arranged along an extension direction of the liquid collecting pipe 310, and the liquid collecting pipe 310 is communicated with each microchannel flat pipe 340. The fin assembly 320 is fastened to the flat pipe 340. The heat exchange working medium flows from the liquid collecting pipe 310 to the microchannel flat pipe 340, and flows out from the liquid collecting pipe 310 on the other side of the microchannel flat pipe 340.

In one embodiment, the wind blocking structure 1000 is located on a side that is of the through hole 330 and that is away from the first side plate 103. In some implementations, the wind blocking structure 1000 is located on a side that is of the through hole 330 and that is adjacent to the first side plate 103.

Figure 12:
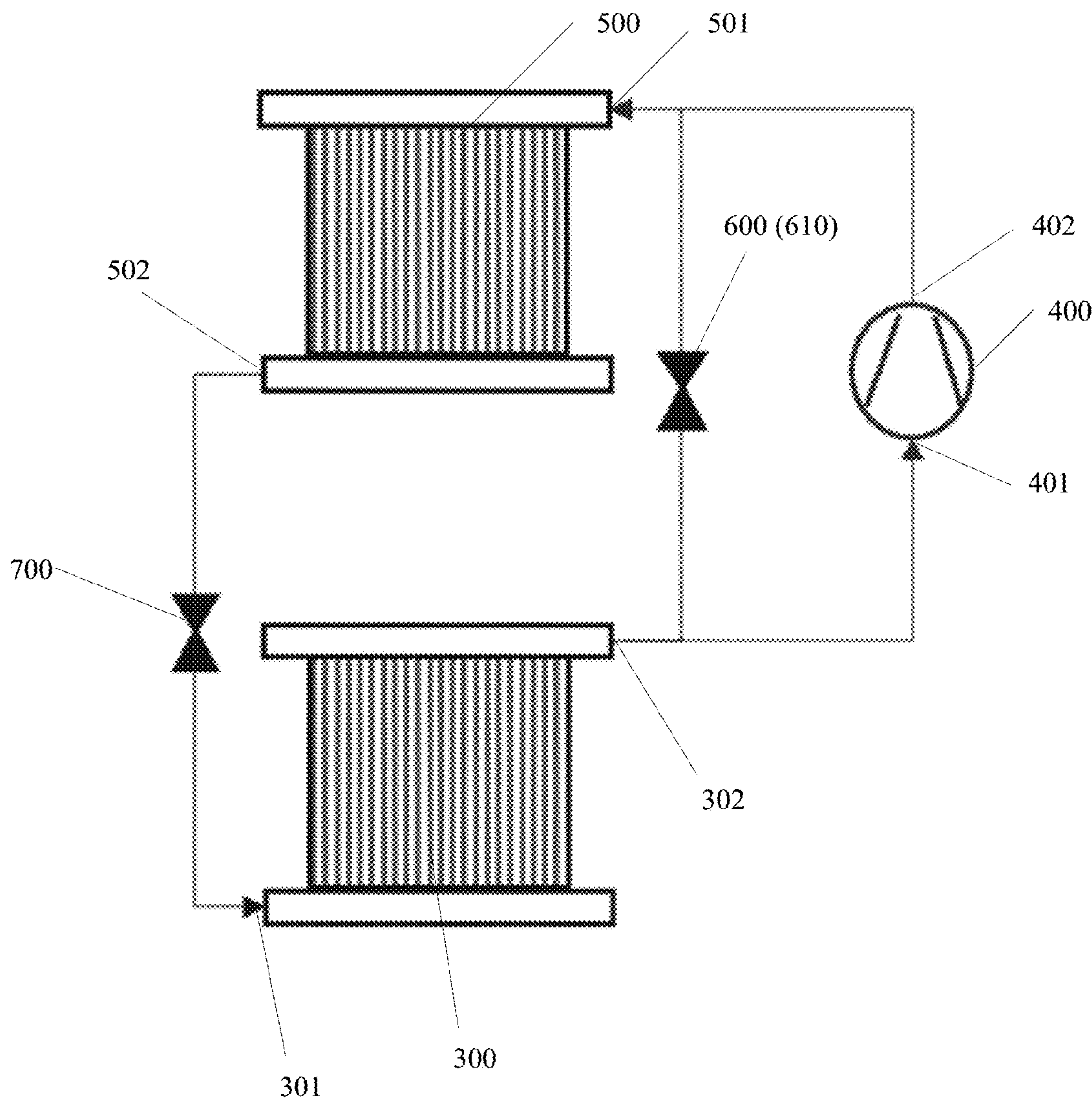
FIG. 12 is a schematic diagram of a structure of a heat exchange device according to an embodiment of this application.

Refer to FIG. 12. In one embodiment, the first valve group 600 includes a first valve 610, and the first valve 610 is connected between the inlet 501 of the condenser 500 and the outlet 302 of the evaporator 300. When the second heat exchange mode is used for heat exchange, the inlet 501 of the condenser 500 is communicated with the outlet 302 of the evaporator 300 by using the first valve 610. In this way, the heat exchange working medium flows between the condenser 500 and the evaporator 300.

In one embodiment, when the first heat exchange mode is used for heat exchange, the inlet 501 of the condenser 500 is closed from the outlet 302 of the evaporator 300 by using a first valve 610. In this implementation, the compressor 400 and the condenser 500 keep being in a communicated state, and the compressor 400 and the evaporator 300 are keep being in a communicated state. When the first heat exchange mode is used for heat exchange, the inlet 501 of the condenser 500 is closed from the outlet 302 of the evaporator 300 by using the first valve 610. In this case, the heat exchange working medium can flow into the condenser 500 only by using the compressor 400. When the second heat exchange mode is used for heat exchange, the compressor 400 does not work, and the compressor 400 is disposed in the internal circulation cavity 110, so that the heat exchange working medium directly flows from the evaporator 300 to the condenser 500. In one embodiment, the first valve 610 is a two-way valve, and the evaporator 300 is communicated with or closed from the condenser 500 by using the two-way valve. In another implementation, the first valve 610 may also be a valve formed by another structure, provided that the evaporator 300 can be communicated with or closed from the condenser 500. This is not limited herein.

The first valve 610 is communicated with the outlet 302 of the evaporator 300 by using a pipe, and the first valve 610 is communicated with the inlet 501 of the condenser 500 by using a pipe. The compressor 400 is communicated with the evaporator 300 by using a pipe, and the compressor 400 is communicated with the condenser 500 by using a pipe. A diameter, length, and shape of the pipe may be set according to a requirement. This is not limited herein.

Figure 13:
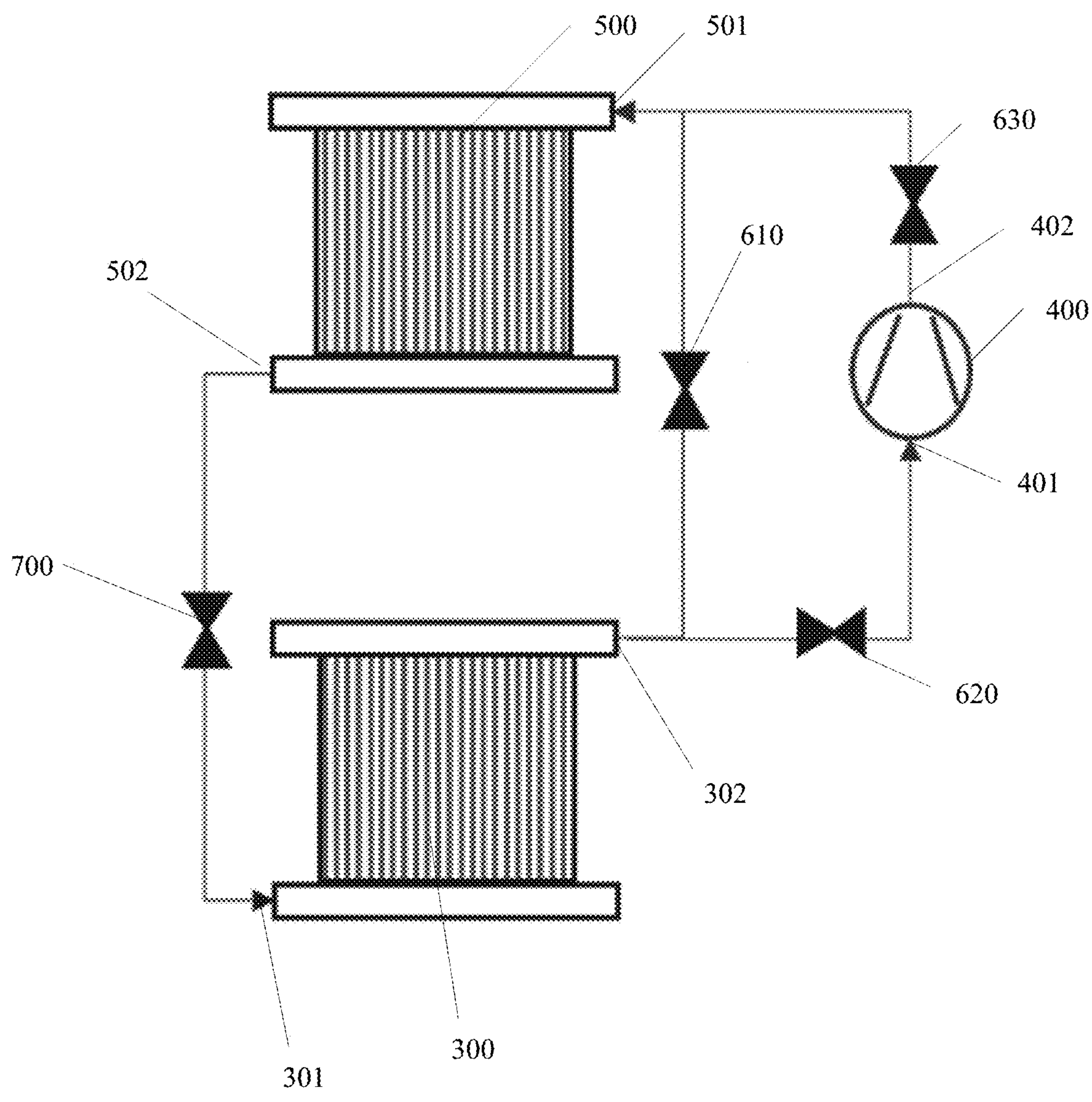
FIG. 13 is a schematic diagram of a structure of a heat exchange device according to an embodiment of this application.

Refer to FIG. 13. In one embodiment, the first valve group 600 further includes a second valve 620 and a third valve 630, the second valve 620 is connected between the outlet 302 of the evaporator 300 and the inlet 401 of the compressor 400, and the third valve 630 is connected between the outlet 402 of the compressor 400 and the inlet 501 of the condenser 500. In the first heat exchange mode, the outlet 302 of the evaporator 300 is communicated with the inlet 401 of the compressor 400 by using the second valve 620, the outlet 402 of the compressor 400 is communicated with the inlet 501 of the condenser 500 by using the third valve 630, and the inlet 501 of the condenser 500 is closed from the outlet 302 of the evaporator 300 by using the first valve 610. In this way, the heat exchange working medium flows between the evaporator 300 and the compressor 400, and between the compressor 400 and the condenser 500.

In one embodiment, when the second heat exchange mode is used for heat exchange, the inlet 301 of the evaporator 300 is closed from the outlet 402 of the compressor 400 by using the second valve 620, the outlet of the compressor 400 is closed from the inlet of the condenser 500 by using the third valve, and the inlet 501 of the condenser 500 is communicated with the outlet 302 of the evaporator 300 by using the first valve 610.

In this implementation, when the second heat exchange mode is used for heat exchange, the second valve 620 and the third valve 630 are closed, to prevent the heat exchange working medium in the evaporator 300 from flowing into the compressor 400, thereby improving heat exchange efficiency of a heat pipe, and protecting the compressor 400. The second valve 620 and the third valve 630 are two-way valves. In another implementation, the second valve 620 and the third valve 630 may alternatively be valves formed by other structures. This is not limited herein.

The second valve 620 is communicated with the outlet 302 of the evaporator 300 by using a pipe, and the second valve 620 is communicated with the inlet 401 of the compressor 400 by using a pipe. The third valve 630 is communicated with the outlet 402 of the compressor 400 by using a pipe, and the third valve 630 is communicated with the inlet 501 of the condenser 500 by using a pipe.

In some implementations, the third valve 630 may not be disposed, the outlet 402 of the compressor 400 is communicated with the inlet 501 of the condenser 500 by using a pipe, and the second valve 620 controls the inlet of the compressor 400 to be communicated with or closed from the outlet of the evaporator 300.

Figure 14:
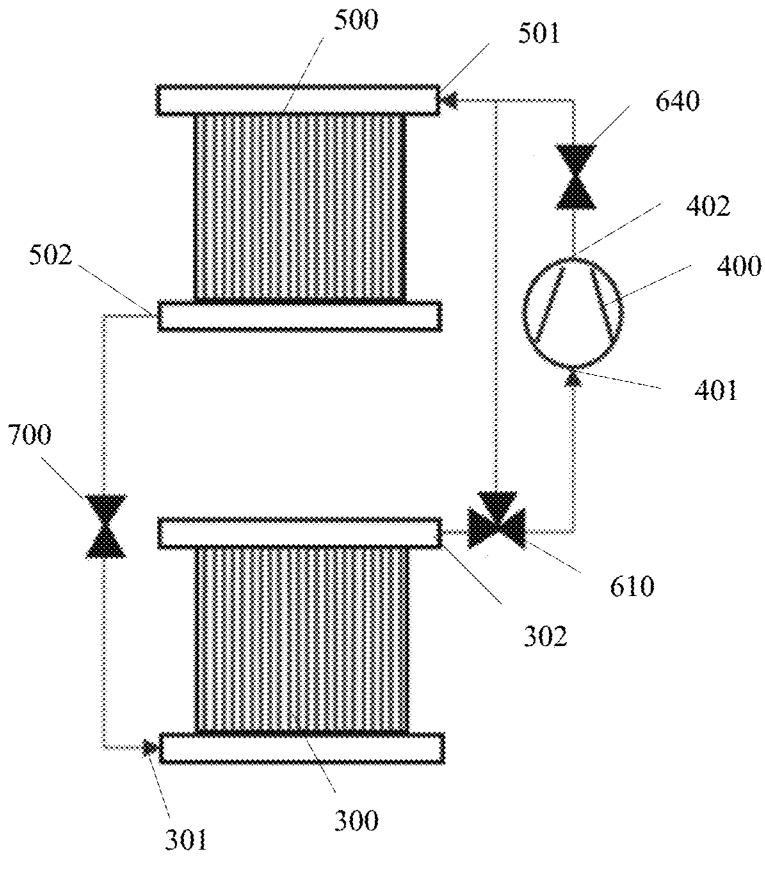
FIG. 14 is a schematic diagram of a structure of a heat exchange device according to an embodiment of this application.

Refer to FIG. 14. In one embodiment, the first valve group 600 further includes a fourth valve 640, the first valve 610 is further connected between the outlet 302 of the evaporator 300 and the inlet 401 of the compressor 400, and the fourth valve 640 is connected between the outlet 402 of the compressor 400 and the inlet 501 of the condenser 500. When the first heat exchange mode is used for heat exchange, the outlet 302 of the evaporator 300 is communicated with the inlet 401 of the compressor 400 by using the first valve 610, and the outlet 402 of the compressor 400 is communicated with the inlet 501 of the condenser 500 by using the fourth valve 640. In this way, the heat exchange working medium flows between the evaporator 300 and the compressor 400, and between the compressor 400 and the condenser 500.

In one embodiment, when the second heat exchange mode is used for heat exchange, the inlet of the evaporator 300 is closed from the outlet of the compressor 400 by using the first valve 610, and the outlet of the compressor 400 is closed from the inlet of the condenser 500 by using the fourth valve 640.

In this implementation, the first valve 610 is a three-way valve, and the fourth valve 640 is a two-way valve. In this implementation, the first valve 610 controls the evaporator 300 to be communicated with or closed from the condenser 500, and the evaporator 300 to be communicated with or closed from the compressor 400, thereby reducing design space. This may be applicable to more application scenarios.

The first valve 610 is communicated with the evaporator 300 by using a pipe, the first valve 610 is communicated with the condenser 500 by using a pipe, and the first valve 610 is communicated with the compressor 400 by using a pipe. The fourth valve 640 is communicated with the outlet 402 of the compressor 400 by using a pipe, and the fourth valve 640 is communicated with the inlet 501 of the condenser 500 by using a pipe.

Figure 15:
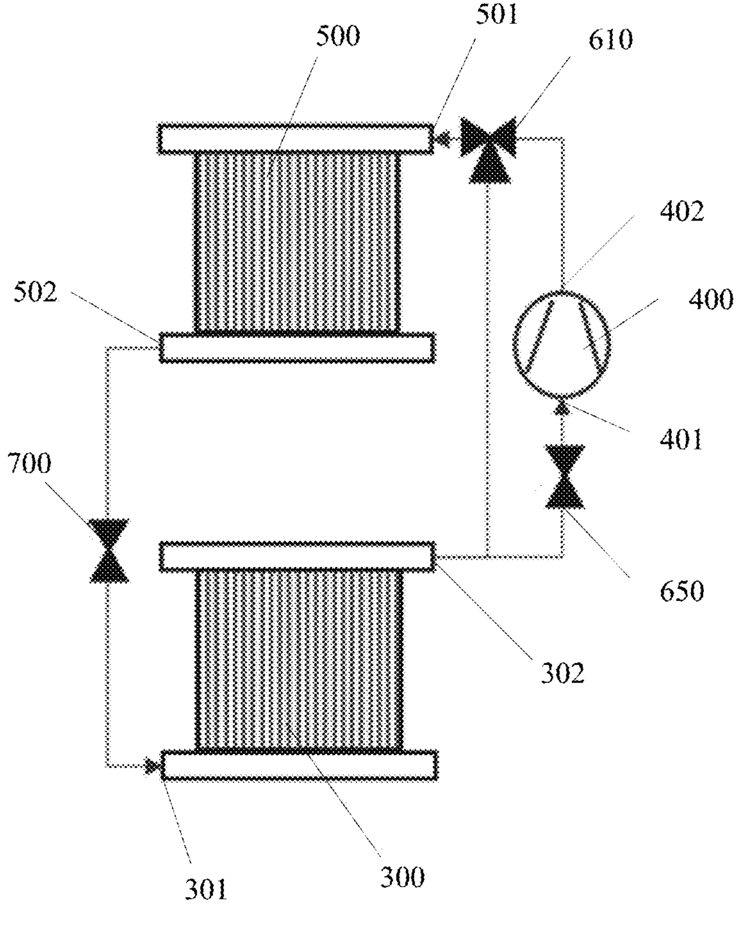
FIG. 15 is a schematic diagram of a structure of a heat exchange device according to an embodiment of this application.

Refer to FIG. 15. In one embodiment, the first valve group 600 further includes a fifth valve 650, the first valve 610 is further connected between the outlet 402 of the compressor 400 and the inlet 501 of the condenser 500, and the fifth valve 650 is connected between the outlet 302 of the evaporator 300 and the inlet 401 of the compressor 400. When the first heat exchange mode is used for heat exchange, the outlet 302 of the evaporator 300 is communicated with the inlet 401 of the compressor 400 by using the fifth valve 650, and the outlet 402 of the compressor 400 is communicated with the inlet 501 of the condenser 500 by using the first valve 610. In this way, the heat exchange working medium flows between the evaporator 300 and the compressor 400, and between the compressor 400 and the condenser 500.

In one embodiment, when the second heat exchange mode is used for heat exchange, the inlet 301 of the evaporator 300 is closed from the outlet 402 of the compressor 400 by using the fifth valve 650, and the outlet 402 of the compressor 400 is closed from the inlet 501 of the condenser 500 by using the first valve 610. In this implementation, the first valve 610 is a three-way valve, and the fifth valve 650 is a two-way valve. In this implementation, the first valve 610 controls the evaporator 300 to be communicated with or closed from the condenser 500, and the compressor 400 to be communicated with or closed from the condenser 500, thereby reducing design space. This may be applicable to more application scenarios.

The first valve 610 is communicated with the evaporator 300 by using a pipe, the first valve 610 is communicated with the condenser 500 by using a pipe, and the first valve 610 is communicated with the compressor 400 by using a pipe. The fifth valve 650 is communicated with the inlet 401 of the compressor 400 by using a pipe, and the fifth valve 650 is communicated with the outlet 302 of the evaporator 300 by using a pipe.

Figure 16:
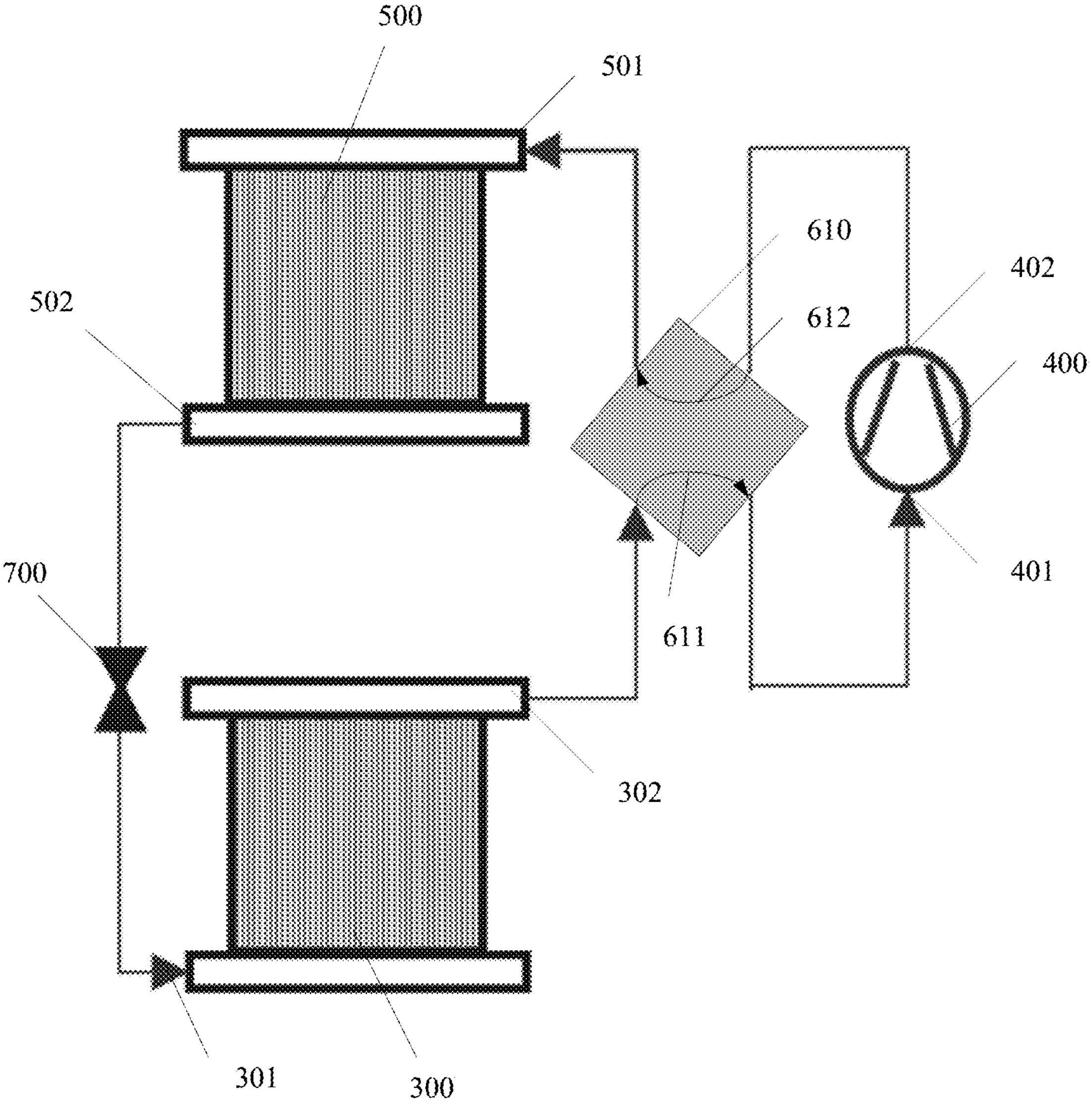
FIG. 16 is a schematic diagram of a structure of a heat exchange device according to an embodiment of this application.
Figure 17:
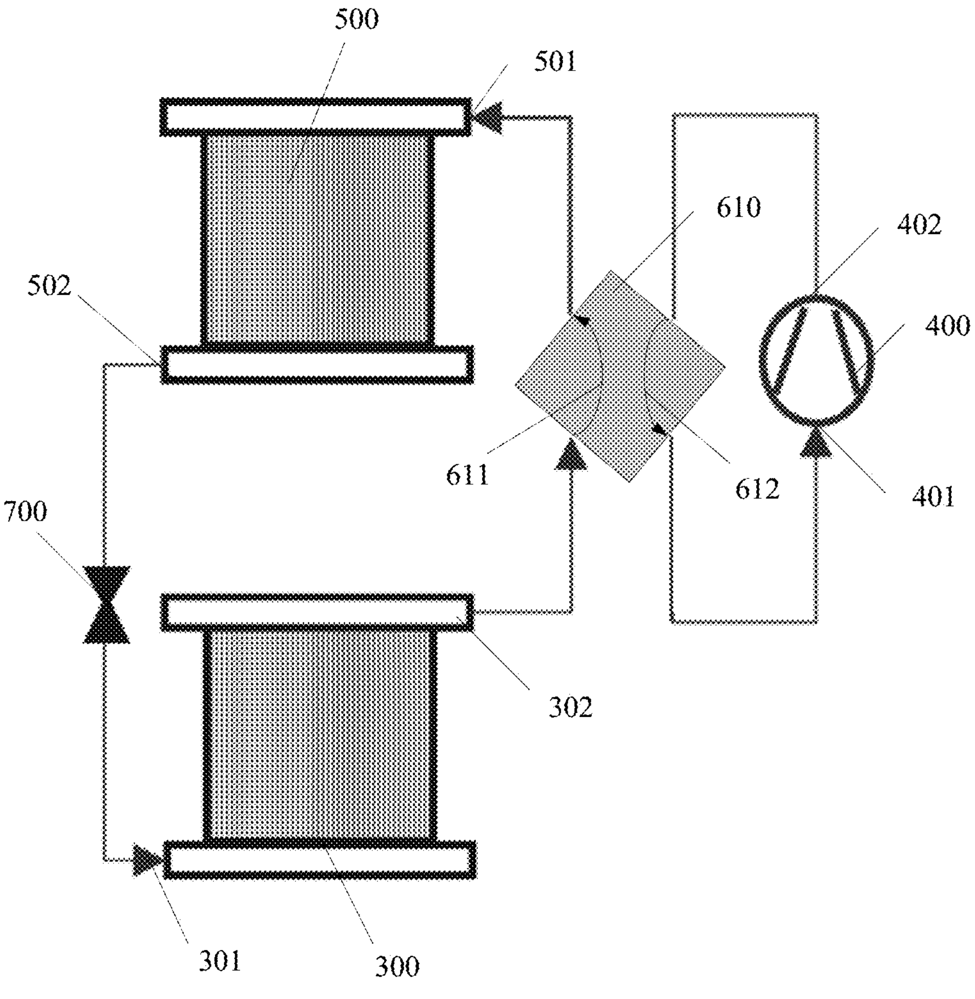
FIG. 17 is a schematic diagram of a structure of a heat exchange device according to an embodiment of this application.

Refer to FIG. 16 and FIG. 17. In one embodiment, the first valve 610 includes a first channel 611 and a second channel 612 that are disposed at an interval, and the first valve 610 is further connected between the inlet 401 of the compressor 400 and the outlet 402 of the compressor 400. When the first heat exchange mode is used for heat exchange (as shown in FIG. 16), the outlet 302 of the evaporator 300 is communicated with the inlet 401 of the compressor 400 by using the first channel 611 of the first valve 610, the outlet 402 of the compressor 400 is communicated with the inlet 501 of the condenser 500 by using the second channel 612 of the first valve 610. A flow path of the heat exchange working medium is: the evaporator 300, the first channel 611, the compressor 400, the second channel 612, and the condenser 500.

When the second heat exchange mode is used for heat exchange (as shown in FIG. 17), the outlet 302 of the evaporator 300 is communicated with the inlet 501 of the condenser 500 by using the first channel 611 of the first valve 610, and the inlet 401 of the compressor 400 is communicated with the outlet 402 of the compressor 400 by using the second channel 612 of the first valve 610. A flow path of the heat exchange working medium is: the evaporator 300, the first channel 611, and the condenser 500.

In this implementation, the first channel 611 and the second channel 612 may be connected to different paths by rotating the first valve 610. For example, when the first heat exchange mode is used for heat exchange, a position of the first valve 610 is shown in FIG. 16. When the first heat exchange mode is switched to the second heat exchange mode, the first valve 610 is rotated clockwise by 90 degrees, so that the first channel 611 is connected between the evaporator 300 and the condenser 500 (as shown in FIG. 17). In this implementation, the first valve 610 having the first channel 611 and the second channel 612 controls a flow path of the heat exchange working medium in the second heat exchange mode and the first heat exchange mode, thereby reducing design space. This may be applicable to more application scenarios.

The first valve 610 may be communicated with each of the outlet 302 of the evaporator 300, the inlet 501 of the condenser 500, the inlet 401 of the compressor 400, and the outlet 402 of the compressor 400 by using a pipe.

Figure 18:
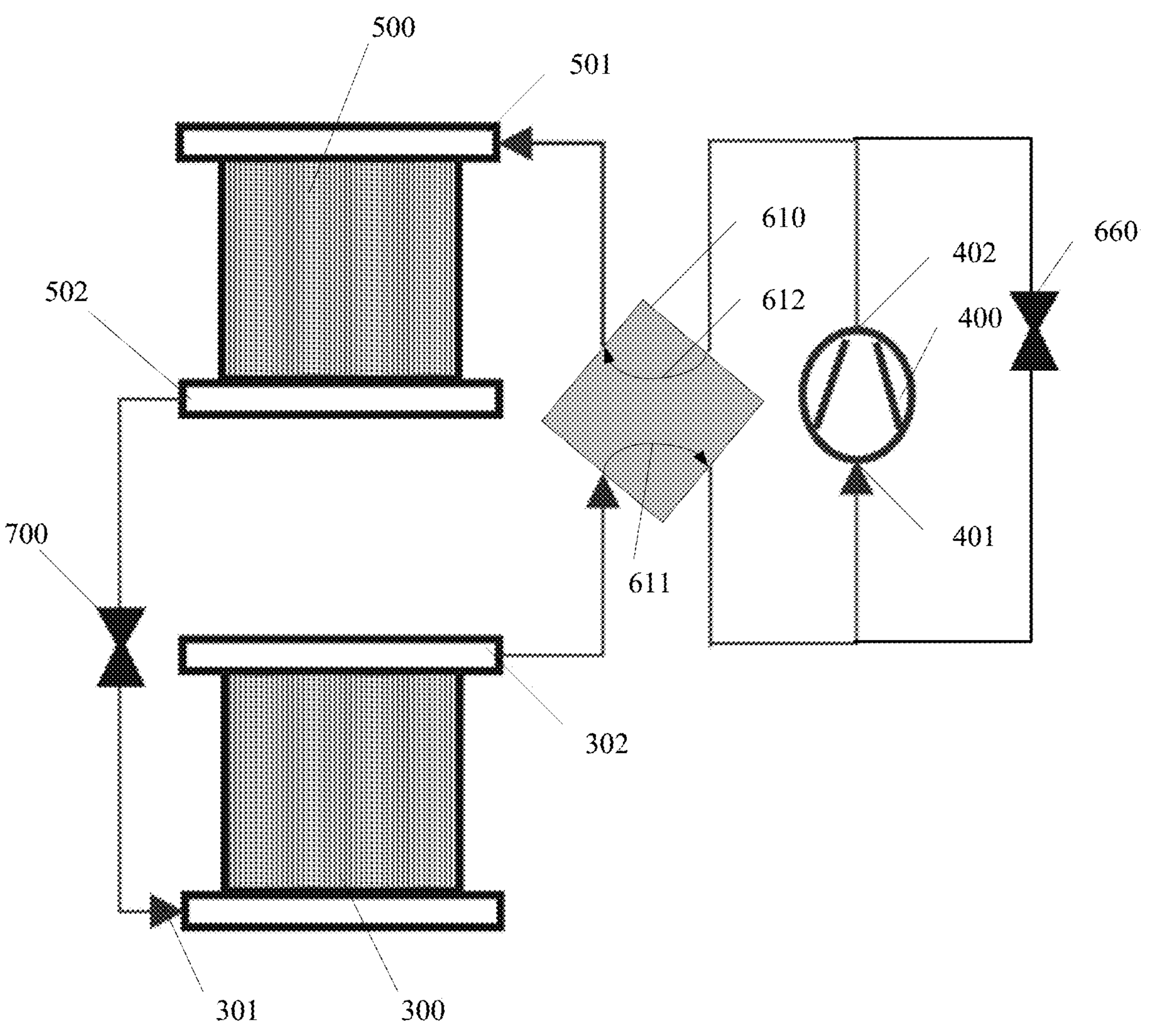
FIG. 18 is a schematic diagram of a structure of a heat exchange device according to an embodiment of this application.

Refer to FIG. 18. In one embodiment, the first valve group 600 further includes a sixth valve 660, and the sixth valve 660 is connected between the inlet 401 of the compressor 400 and the outlet 402 of the compressor 400. In this implementation, the sixth valve 660 is a bypass valve. When a heat exchange requirement is low, that is, when an excessively high refrigerating capacity is not needed, and the compressor 400 still has an excessively high refrigerating capacity when running at a minimum speed, the sixth valve 660 is opened to allow some heat exchange working media to flow back to the compressor 400. In this way, the heat exchange working medium flowing to the condenser 500 is reduced, and an actual capability of the compressor 400 to drive the heat exchange working medium is reduced, so that a refrigerating capacity of the heat exchange device matches a required refrigerating capacity.

In one embodiment, an opening degree of the sixth valve 660 may be adjusted. When a required refrigerating capability decreases, the opening degree of the sixth valve 660 may be increased, to reduce the heat exchange working medium flowing to the condenser 500. When the required refrigerating capability increases, the opening degree of the sixth valve 660 may be decreased until the sixth valve 660 is completely closed.

It should be noted that the sixth valve 660 may be applicable to the embodiments in FIG. 12 to FIG. 15, and the sixth valve 660 is connected between the inlet 401 of the compressor 400 and the outlet 402 of the compressor 400 in the embodiments shown in FIG. 12 to FIG. 15.

Figure 19A:
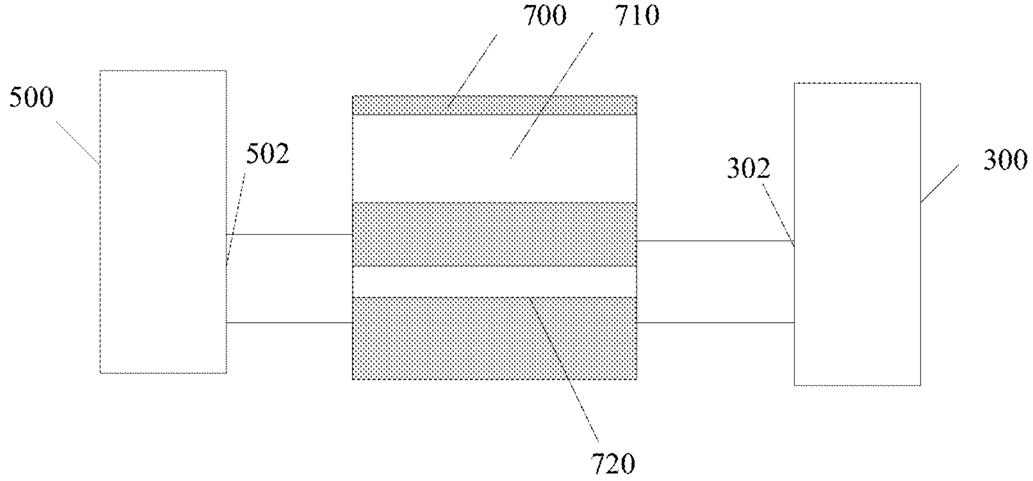
FIG. 19*a* is a schematic diagram of structures of a condenser, a second valve group, and an evaporator in a heat exchange device according to an embodiment of this application.
Figure 19B:
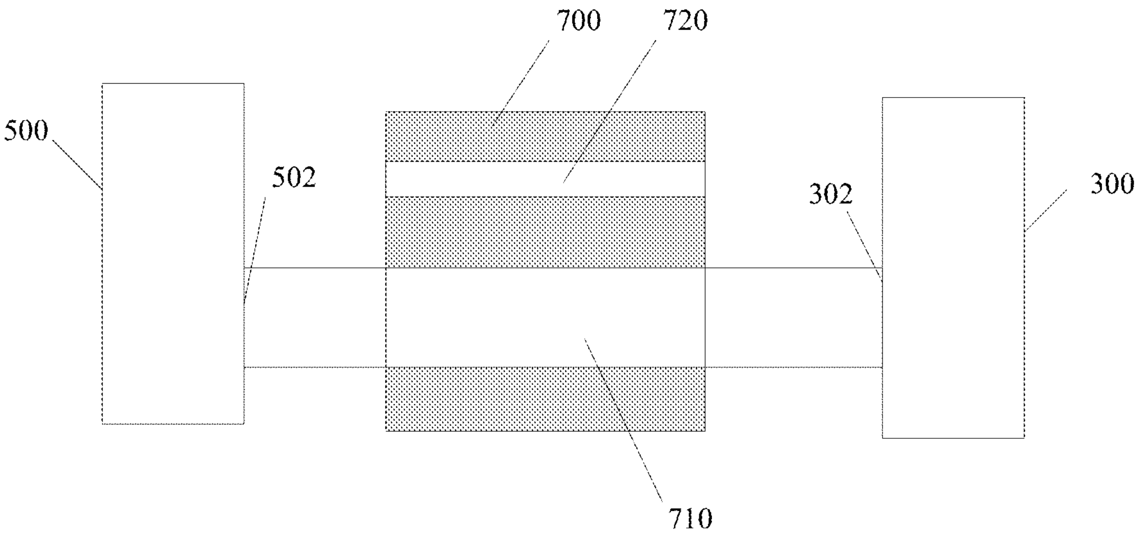
FIG. 19*b* is a schematic diagram of structures of a condenser, a second valve group, and an evaporator in a heat exchange device according to an embodiment of this application.

Refer to FIG. 19*a* and FIG. 19*b*. In one embodiment, a second valve group 700 includes a third channel 710 and a fourth channel 720, and a through-flow cross-sectional area of the third channel 710 is greater than a through-flow cross-sectional area of the fourth channel 720. When the first heat exchange mode is used for heat exchange (as shown in FIG. 19*a*), the outlet 502 of the condenser 500 is communicated with the inlet 301 of the evaporator 300 by using the fourth channel 720. When the second heat exchange mode is used for heat exchange (as shown in FIG. 19*b*), the outlet of the condenser 500 is communicated with the inlet of the evaporator 300 by using the third channel 710. The through-flow cross-sectional area of the third channel 710 is greater than the through-flow cross-sectional area of the fourth channel 720, so that flow resistance of the third channel 710 is less than flow resistance of the fourth channel 720. In the second heat exchange mode, the heat exchange working medium absorbs heat and becomes a high-temperature and high-pressure heat exchange working medium. The high-temperature and high-pressure heat exchange working medium has a flow power. The heat exchange working medium mainly provides the flow power based on a state of the heat exchange working medium, and the flow power is generally small. In this application, in the second heat exchange mode, the outlet of the condenser 500 is communicated with the inlet of the evaporator 300 by using the third channel 710. The flow resistance of the third channel 710 is small, which is conducive to flow of the heat exchange working medium, and improves heat exchange efficiency in the second heat exchange mode. Specific through-flow cross-sectional areas of the third channel 710 and the fourth channel 720 may be set according to an actual requirement. The third channel 710 may be switched to the fourth channel 720, or the fourth channel 720 may be switched to the third channel 710 by driving the second valve group 700 to rotate or move. In one embodiment, a flow volume of the fourth channel 720 may be controlled to implement precise flow adjustment in the first heat exchange mode.

Figure 20:
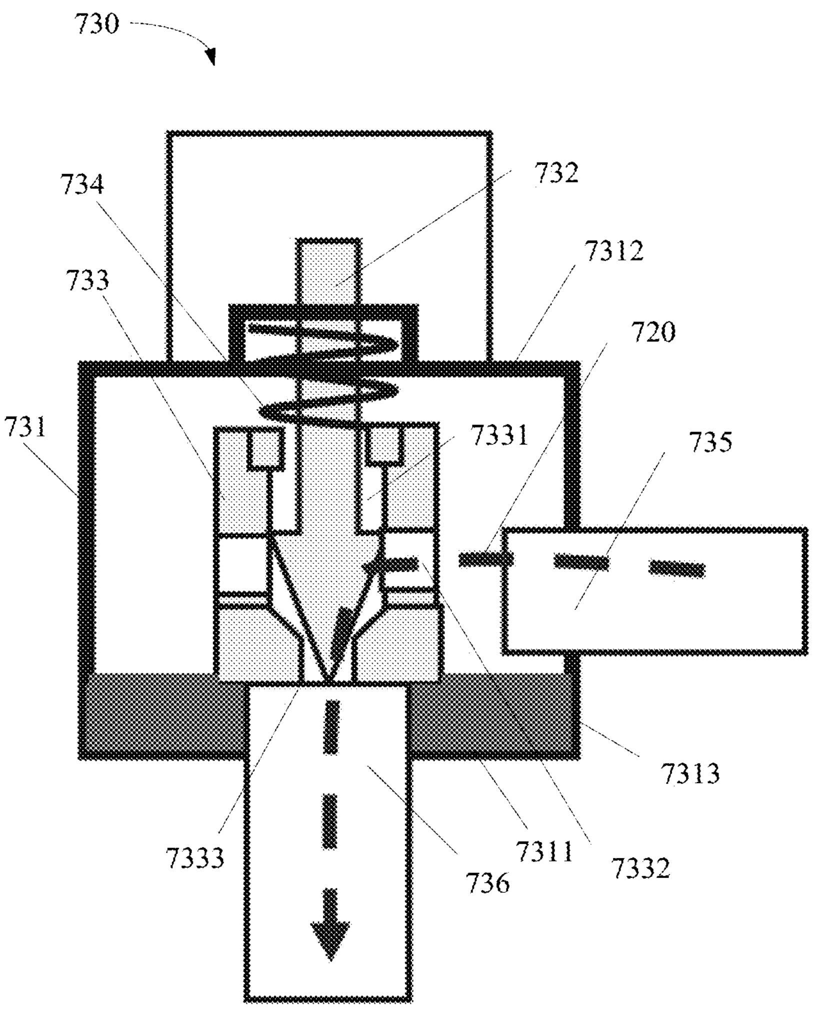
FIG. 20 is a schematic diagram of a structure of a second valve group when a heat exchange device is in a first heat exchange mode according to an embodiment of this application.
Figure 21:
FIG. 21 is a schematic diagram of a structure of a second valve group when a heat exchange device is in a second heat exchange mode according to an embodiment of this application.
Figure 21:
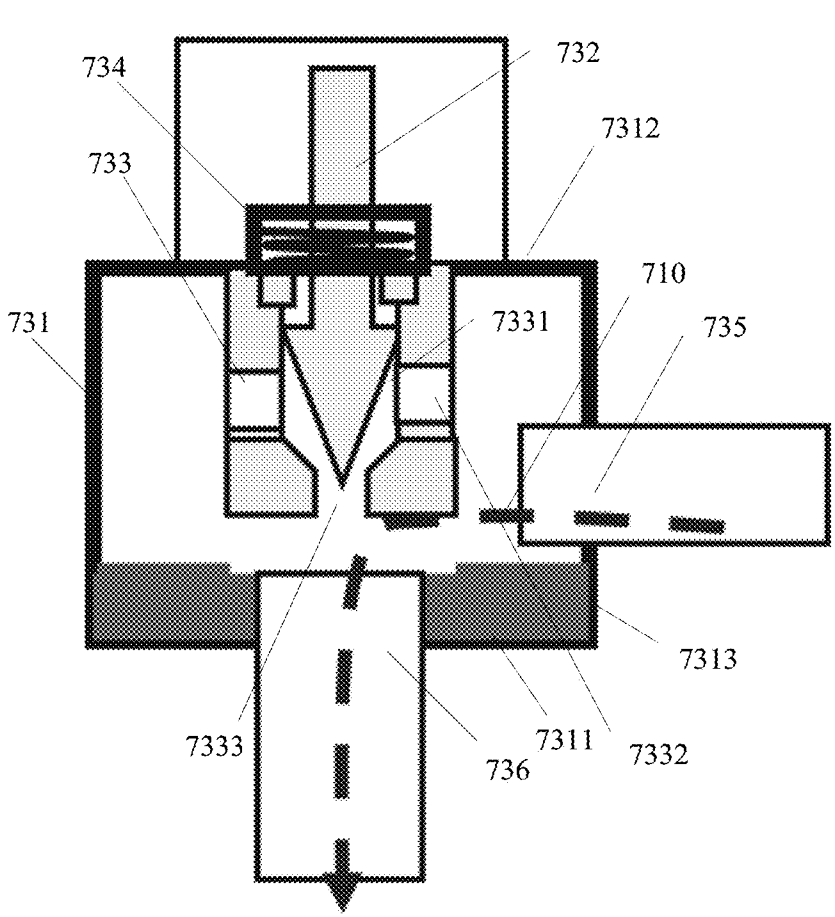

Refer to FIG. 20 and FIG. 21. In one embodiment, the second valve group 700 is a two-segment electronic expansion valve 730, and the two-segment electronic expansion valve 730 includes a valve housing 731, a first valve core 732, a second valve core 733, and a spring 734. The valve housing 731 includes a first side housing 7311 and a second side housing 7312 that are oppositely disposed, and a third side housing 7313 located between the first side housing 7311 and the second side housing 7312. The third side housing 7313 is provided with a first valve inlet 735, and the first side housing 7311 is provided with a first valve outlet 736. The first valve inlet 735 is communicated with the outlet 502 of the condenser 500, and the first valve outlet 736 is communicated with the inlet 301 of the evaporator 300. The second valve core 733 is located in the valve housing 731, and the first valve core 732 penetrates the second side housing 7312 and extends to the second valve core 733. One end of the spring 734 is fastened to the second side housing 7312, the spring 734 is sleeved on one end of the first valve core 732, and the other end of the spring 734 is fastened to the second valve core 733. An accommodating channel 7331 is disposed in the second valve core 733, and the other end of the first valve core 732 is located in the accommodating channel 7331. A first opening 7332 and a second opening 7333 are disposed in the second valve core 733. The first opening 7332 and the first valve inlet 735 are oppositely disposed and connected, and the second opening 7333 and the first valve outlet 736 are oppositely disposed and connected. The first opening 7332 and the second opening 7333 are communicated with the accommodating channel 7331, and an end that is of the second valve core 733 and that is far away from the spring 734 is located in the second opening 7333.

When the first heat exchange mode is used for heat exchange (as shown in FIG. 20), the first valve inlet 735, the first opening 7332, part of the accommodating channel 7331, the second opening 7333, and the first valve outlet 736 form the fourth channel 720. The first valve core 732 may be controlled to move away from the first valve outlet 736, to control an opening degree of the fourth channel 720, thereby implementing precise adjustment of a flow area and implementing precise flow adjustment.

When the mode is switched to the second heat exchange mode (as shown in FIG. 21), the first valve core 732 is driven to move away from the first valve outlet 736. The first valve core 732 drives the second valve core 733 to move away from the first valve outlet 736, and the spring 734 is compressed. In this case, the first valve inlet 735, space between the second valve core 733 and an inner wall of the valve housing 731, and the first valve outlet 736 form the third channel 710. The third channel 710 has a large flow area and low flow resistance, which is conducive to flow of the heat exchange working medium, and improves heat exchange efficiency. When it is required to switch to the first heat exchange mode again, the first valve inlet 735 and the second valve core 733 are driven to move close to the first valve outlet 736. The spring 734 returns to drive the first valve inlet 735 and the second valve core 733 to move, thereby improving a switching speed. Switching between the third channel 710 and the fourth channel 720 may be implemented by driving the first valve core 732 and the second valve core 733 to move.

It should be noted that a structure of the two-segment electronic expansion valve 730 is not limited to the structure shown in FIG. 20, and further includes more or fewer components, provided that switching between the third channel 710 and the fourth channel 720 may be implemented by driving the first valve core 732 and the second valve core 733 to move. The opening degree of the fourth channel 720 may be controlled by controlling the first valve core 732 to move away from the first valve outlet 736, to implement precise adjustment of a flow area.

Figure 22:
FIG. 22 is a schematic diagram of a structure of a second valve group when a heat exchange device is in a second heat exchange mode according to an embodiment of this application.
Figure 22:
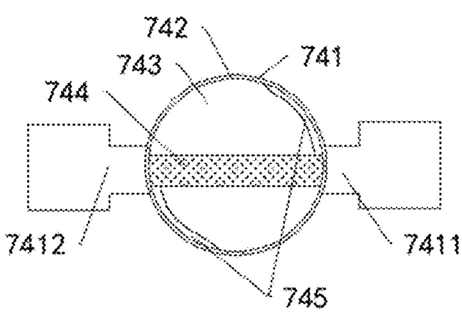
Figure 23:
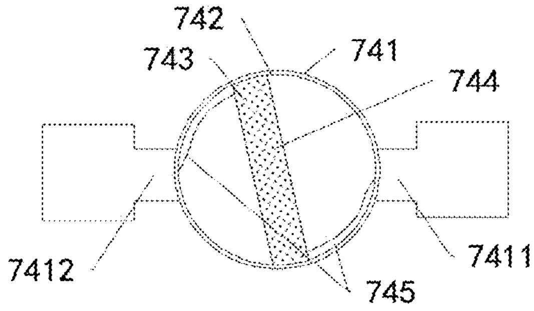
FIG. 23 is a schematic diagram of a structure of a second valve group when a heat exchange device is in a first heat exchange mode according to an embodiment of this application.

Refer to FIG. 22 and FIG. 23. In one embodiment, the second valve group 700 is a ball valve 740 with a notch groove. Specifically, the ball valve 740 includes a ball valve housing 741 and a ball valve core 742 located in the ball valve housing 741. The ball valve core 742 is attached to an inner wall of the ball valve housing 741, and the ball valve core 742 can rotate in the ball valve housing 741. The ball valve core 742 includes a ball valve body 743. A valve channel 744 extending along a radial direction is disposed in the ball valve body 743. The ball valve housing 741 includes a second valve inlet 7411 and a second valve outlet 7412 that are oppositely disposed. When the second heat exchange mode is used for heat exchange (as shown in FIG. 22), the second valve inlet 7411, the valve channel 744, and the second valve outlet 7412 form the third channel 710. Two grooves 745 are disposed on a surface of the ball valve body 743. One groove 745 is disposed adjacent to the second valve inlet 7411, and one end of the groove 745 is connected to and communicated with the valve channel 744. The other groove 745 is disposed adjacent to the second valve outlet 7412, and one end of the groove 745 is connected to and communicated with the valve channel 744. A cross-sectional area of the groove 745 is less than a cross-sectional area of the valve channel 744. In the first heat exchange mode (as shown in FIG. 23), the second valve inlet 7411, the groove 745, the valve channel 744, and the second valve outlet 7412 form the fourth channel 720. Switching between the third channel 710 and the fourth channel 720 may be implemented by rotating the ball valve core 742, and a length of the groove 745 located between the second valve inlet 7411 and the valve channel 744 may be controlled by rotating the ball valve core 742. Because the cross-sectional area of the groove 745 is less than the cross-sectional area of the valve channel 744, the fourth channel 720 is formed by the second valve inlet 7411, a groove part between the second valve inlet 7411 and the valve channel 744, a groove part between the second valve outlet 7412 and the valve channel 744, and the second valve outlet 7412. The longer the length of the groove 745 located between the second valve inlet 7411 and the valve channel 744, the smaller the flow of the fourth channel 720, and the shorter the length of the groove 745 located between the second valve inlet 7411 and the valve channel 744, the larger the flow of the fourth channel 720. In this way, precise adjustment of a flow area is implemented and precise flow adjustment is implemented.

In another implementation, two channels with different through-flow cross-sectional areas may be further disposed in the ball valve core 742 as the third channel 710 and the fourth channel 720.

It should be noted that a structure of the ball valve 740 with a notch groove is not limited to the structure shown in FIG. 22, and further includes more or fewer components, provided that switching between the third channel 710 and the fourth channel 720 may be implemented by rotating the ball valve core 742. A flow volume of the fourth channel 720 may be controlled by rotating the ball valve core 742, to implement precise adjustment of a flow area.

In one embodiment, the second valve group 700 is located in the internal circulation cavity 110. An environment inside the internal circulation cavity 110 is safer, has less dust than that inside the external circulation cavity 120, and is free from wind and rain. In addition, the internal circulation cavity 110 has no smoke that corrodes the second valve group 700, so that the second valve group 700 has a longer service life and is not easily damaged. In some cases, the second valve group 700 may alternatively be disposed in the external circulation cavity 120.

The heat exchange device and the heat exchange system provided in embodiments of this application are described in detail above. The principles and embodiments of this application are described herein by using specific examples. The description about the foregoing embodiments is merely provided to help understand the method and core ideas of this application. In addition, a person of ordinary skill in the art can make variations and modifications in terms of the specific embodiments and application scopes according to the ideas of this application. In conclusion, the content of this specification shall not be construed as a limitation to this application.

What is claimed is:

1. A heat exchange device, comprising:

a housing;

a partition plate dividing space inside the housing into an internal circulation cavity and an external circulation cavity, wherein the internal circulation cavity is configured to be communicated with an indoor environment, and the external circulation cavity is configured to be communicated with an outdoor environment;

an evaporator located in the internal circulation cavity; and a compressor located in the internal circulation cavity, wherein a first valve group is disposed between an inlet of the compressor and an outlet of the evaporator; and wherein the heat exchange device has a first heat exchange mode, when the first heat exchange mode is used for a heat exchange, the outlet of the evaporator is communicated with the inlet of the compressor by using the first valve group; and wherein the heat exchange device further has a second heat exchange mode, and the heat exchange device further comprises a condenser, wherein the condenser is located in the external circulation cavity, the first valve group is further located between the inlet of the condenser and the outlet of the evaporator; and when the second heat exchange mode is used for the heat exchange, the outlet of the evaporator is communicated with the inlet of the condenser by using the first valve group, such that a heat exchange working medium inside the evaporator flows to the condenser after being heated.

2. The heat exchange device according to claim 1, wherein an inlet of the condenser is communicated with an outlet of the compressor, and an outlet of the condenser is communicated with an inlet of the evaporator.

3. The heat exchange device according to claim 2, wherein the first valve group comprises a first valve connected between the inlet of the condenser and the outlet of the evaporator; and when the second heat exchange mode is used for the heat exchange, the inlet of the condenser is communicated with the outlet of the evaporator by using the first valve.

4. The heat exchange device according to claim 3, wherein the first valve group further comprises a second valve and a third valve, the second valve is connected between the outlet of the evaporator and the inlet of the compressor, and the third valve is connected between the outlet of the compressor and the inlet of the condenser; and when the first heat exchange mode is used for the heat exchange, the outlet of the evaporator is communicated with the inlet of the compressor by using the second valve, and the outlet of the compressor is communicated with the inlet of the condenser by using the third valve.

5. The heat exchange device according to claim 4, wherein the first valve group further comprises a sixth valve connected between the inlet of the compressor and the outlet of the compressor.

6. The heat exchange device according to claim 3, wherein the first valve group further comprises a fourth valve, the first valve is further connected between the outlet of the evaporator and the inlet of the compressor, and the fourth valve is connected between the outlet of the compressor and the inlet of the condenser; and when the first heat exchange mode is used for the heat exchange, the outlet of the evaporator is communicated with the inlet of the compressor by using the first valve, and the outlet of the compressor is communicated with the inlet of the condenser by using the fourth valve.

7. The heat exchange device according to claim 6, wherein the first valve group further comprises a sixth valve connected between the inlet of the compressor and the outlet of the compressor.

8. The heat exchange device according to claim 3, wherein the first valve group further comprises a fifth valve connected between the outlet of the evaporator and the inlet of the compressor, the first valve is further connected between the outlet of the compressor and the inlet of the condenser; and when the first heat exchange mode is used for the heat exchange, the outlet of the evaporator is communicated with the inlet of the compressor by using the fifth valve, and the outlet of the compressor is communicated with the inlet of the condenser by using the first valve.

9. The heat exchange device according to claim 8, wherein the first valve group further comprises a sixth valve connected between the inlet of the compressor and the outlet of the compressor.

10. The heat exchange device according to claim 3, wherein the first valve comprises a first channel and a second channel that are disposed at an interval, and the first valve is further connected between the inlet of the compressor and the outlet of the compressor; and when the first heat exchange mode is used for the heat exchange, the outlet of the evaporator is communicated with the inlet of the compressor by using the first channel in the first valve, and the outlet of the compressor is communicated with the inlet of the condenser by using the second channel in the first valve; or when the second heat exchange mode is used for the heat exchange, the outlet of the evaporator is communicated with the inlet of the condenser by using the first channel in the first valve.

11. The heat exchange device according to claim 10, wherein the first valve group further comprises a sixth valve connected between the inlet of the compressor and the outlet of the compressor.

12. The heat exchange device according to claim 3, wherein the first valve group further comprises a sixth valve connected between the inlet of the compressor and the outlet of the compressor.

13. The heat exchange device according to claim 2, wherein a second valve group comprises a third channel and a fourth channel, and a through-flow cross-sectional area of the third channel is greater than a through-flow cross-sectional area of the fourth channel; and when the first heat exchange mode is used for the heat exchange, the outlet of the condenser is communicated with the inlet of the evaporator by using the fourth channel; or when the second heat exchange mode is used for the heat exchange, the outlet of the condenser is communicated with the inlet of the evaporator by using the third channel.

14. The heat exchange device according to claim 13, wherein the second valve group is a two-segment electronic expansion valve or a ball valve with a notch groove.

15. The heat exchange device according to claim 1, wherein the housing comprises a first side plate and a second side plate that are oppositely disposed along a second direction, the partition plate is located between the first side plate and the second side plate, the partition plate comprises a main plate and a branching plate that are connected to each other, the branching plate protrudes from the main plate to the second side plate, and the compressor and the evaporator are located between the branching plate and the first side plate in the second direction.

16. The heat exchange device according to claim 15, wherein the main plate and the branching plate are of an integrated structure.

17. The heat exchange device according to claim 1, wherein the housing comprises a first side plate and a bottom plate, the first side plate intersects and is connected to the bottom plate, the first side plate located on a side of the evaporator and away from the partition plate, there is a first gap between the evaporator and the first side plate, and there is a second gap between the evaporator and the bottom plate.

18. The heat exchange device according to claim 1, wherein the evaporator comprises a liquid collecting pipe and a fin assembly, there is a through hole between the fin assembly and the liquid collecting pipe, the heat exchange device further comprises a wind blocking structure covering at least an opening at an end of the through hole.

19. A heat exchange system, comprising:

an accommodation room;

a heat source; and a heat exchange device comprising:

a housing;

a partition plate dividing space inside the housing into an internal circulation cavity and an external circulation cavity, wherein the internal circulation cavity is configured to be communicated with an indoor environment, and the external circulation cavity is configured to be communicated with an outdoor environment;

an evaporator located in the internal circulation cavity; and a compressor located in the internal circulation cavity, wherein a first valve group is disposed between an inlet of the compressor and an outlet of the evaporator; and wherein the heat exchange device has a first heat exchange mode, when the first heat exchange mode is used for a heat exchange, the outlet of the evaporator is communicated with the inlet of the compressor by using the first valve group; wherein the heat source is located in the accommodation room, the internal circulation cavity in the heat exchange device is communicated with the accommodation room, and the heat exchange device is configured to dissipate heat for the heat source; and wherein the heat exchange device further has a second heat exchange mode, and the heat exchange device further comprises a condenser, wherein the condenser is located in the external circulation cavity, the first valve group is further located between the inlet of the condenser and the outlet of the evaporator; and when the second heat exchange mode is used for the heat exchange, the outlet of the evaporator is communicated with the inlet of the condenser by using the first valve group, such that a heat exchange working medium inside the evaporator flows to the condenser after being heated.

20. The heat exchange system according to claim 19, wherein the heat exchange system is one of a cabinet, a container, or a data center.

* * * * *